United States Patent
Lok et al.

(10) Patent No.: US 10,483,995 B1
(45) Date of Patent: Nov. 19, 2019

(54) CALIBRATION OF RADIX ERRORS USING LEAST-SIGNIFICANT-BIT (LSB) AVERAGING IN A SUCCESSIVE-APPROXIMATION REGISTER ANALOG-DIGITAL CONVERTER (SAR-ADC) DURING A FULLY SELF-CALIBRATING ROUTINE

(71) Applicant: Caelus Technologies Limited, Hong Kong (HK)

(72) Inventors: Chi Fung Lok, Hong Kong (HK); Xiaoyong He, Hong Kong (HK)

(73) Assignee: Caelus Technologies Limited, Hong Kong (HK)

(*) Notice: Subject to any disclaimer, the term of this patent is extended or adjusted under 35 U.S.C. 154(b) by 0 days.

(21) Appl. No.: 16/283,721

(22) Filed: Feb. 22, 2019

(51) Int. Cl.
  *H03M 1/10* (2006.01)
  *H03M 1/46* (2006.01)
  *H03M 1/12* (2006.01)
  *H03M 1/06* (2006.01)
  *H03M 1/00* (2006.01)

(52) U.S. Cl.
  CPC ....... *H03M 1/1047* (2013.01); *H03M 1/1042* (2013.01); *H03M 1/1071* (2013.01); *H03M 1/462* (2013.01); *H03M 1/468* (2013.01); *H03M 1/00* (2013.01); *H03M 1/06* (2013.01); *H03M 1/10* (2013.01); *H03M 1/12* (2013.01)

(58) Field of Classification Search
  CPC ............ H03M 1/10; H03M 1/06; H03M 1/12; H03M 1/00
  USPC .................. 341/120, 118, 161, 155, 162, 163
  See application file for complete search history.

(56) References Cited

U.S. PATENT DOCUMENTS 5,668,549 A * 9/1997 Opris .................... H03M 1/069
  341/118
6,707,403 B1  3/2004 Hurrell
  (Continued)

OTHER PUBLICATIONS

Liu et al, "A 12-bit, 45-MS/s, 3-mW Redundant Successive-Approximation-Register Analog-to-Digital Converter With Digital Calibration", IEEE JSSC vol. 46 No. 11 Nov. 2011, pp. 2661-2672.
(Continued)

*Primary Examiner* — Joseph J Lauture
(74) *Attorney, Agent, or Firm* — Stuart T. Auvinen; gPatent LLC

(57) ABSTRACT

A self-calibrating Analog-to-Digital Converter (ADC) performs radix error calibration using a Successive-Approximation Register (SAR) to drive test voltages onto lower-significant capacitors. The final SAR code is corrected by performing LSB averaging on LSB averaging capacitors and then accumulated, and the measurement repeated many times to obtain a digital average measurement. An ideal radix or ratio of the measured capacitor's capacitance to a unit capacitance of an LSB capacitor is subtracted from the digital average measurement to obtain a measured error that is stored in a Look-Up Table (LUT) with the ideal radix. Radix error calibration is repeated for other capacitors to populate the LUT. During normal ADC conversion, the SAR code obtained from converting the analog input is applied to addresses the LUT, and all ideal radixes and measured errors for 1 bits in the SAR code are added together to generate an error-corrected digital value.

20 Claims, 26 Drawing Sheets

(56) References Cited

U.S. PATENT DOCUMENTS

| | | |
|---|---|---|
| 8,223,044 B2 | 7/2012 | Snedeker |
| 8,446,304 B2 | 5/2013 | Scanlan |
| 9,432,044 B1 | 8/2016 | Lee et al. |
| 9,641,189 B2 | 5/2017 | Maddox et al. |

OTHER PUBLICATIONS

Lee et al., "A 12b 70MS/s SAR ADC with Digital Startup Calibration in 14nm CMOS", 2015 Sym. VLSI Circuits Digest of Tech. papers, C62-C63, 2015.

Li et al, "A Signal-Independent Background-Calibrating 20b 1MS/s SAR ADC with 0.3ppm INL", ISSCC 2018 14.7, pp. 242-243, 2018.

Harpe et. al., "An oversampled 12/14b SAR ADC with noise reduction and linearity enhancements achieving up to 79.1dB SNDR", IEEE ISSCC Dig. Tech Papers, pp. 194-195, Feb. 2014.

Morie et. al., "A 4.2 mW 50MS/s 13 bit CMOS SAR ADC With SNR and SFDR Enhancement Techniques", IEEE Journal of Solid-State Circuits, vol. 50, No. 6, pp. 1372-1381, Jun. 2015.

Chen et. al., "A 0.7-V 0.6-µW 100-kS/s Low Power SAR ADC with Statistical Estimation-Based Noise Reduction", IEEE Journal of Solid-State Circuits, vol. 52, No. 5, pp. 1388-1398, May 2017.

\* cited by examiner

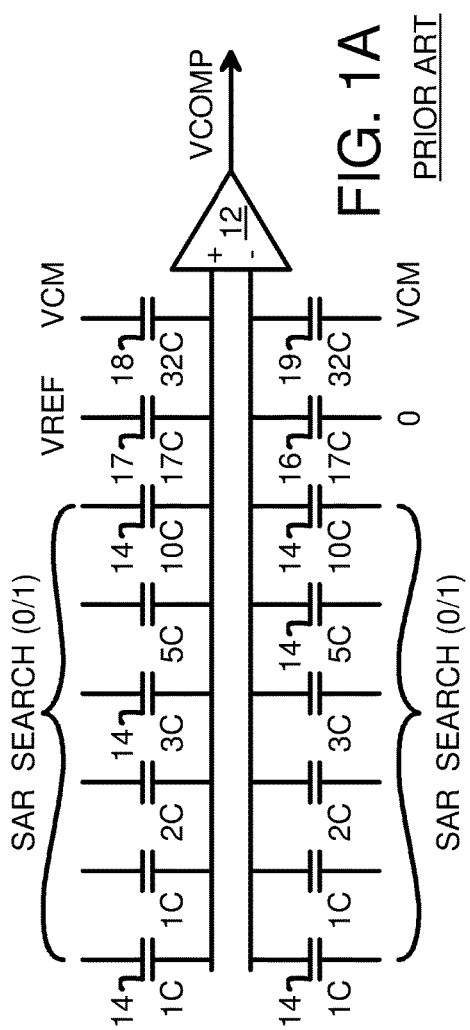
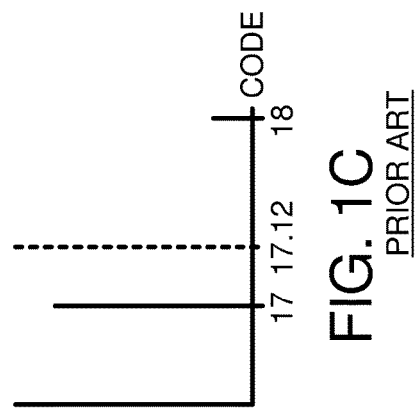
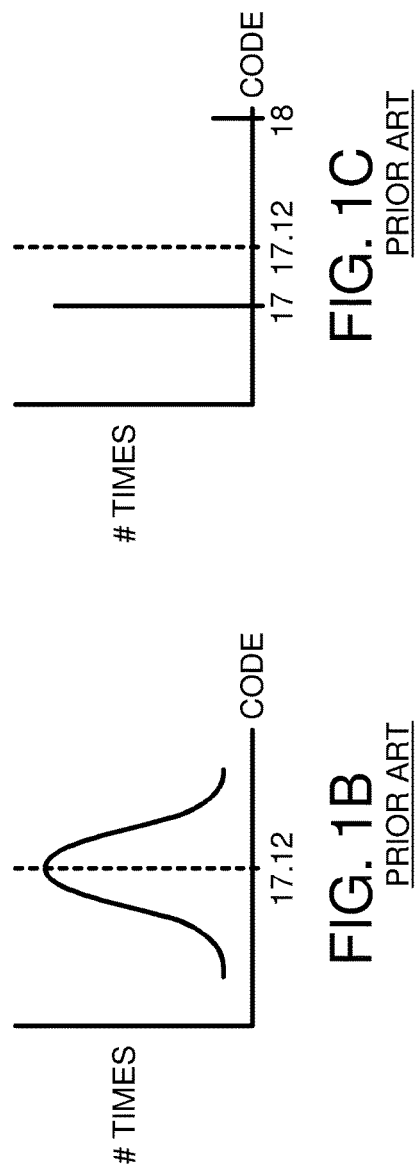
FIG. 1A PRIOR ART
FIG. 1B PRIOR ART
FIG. 1C PRIOR ART

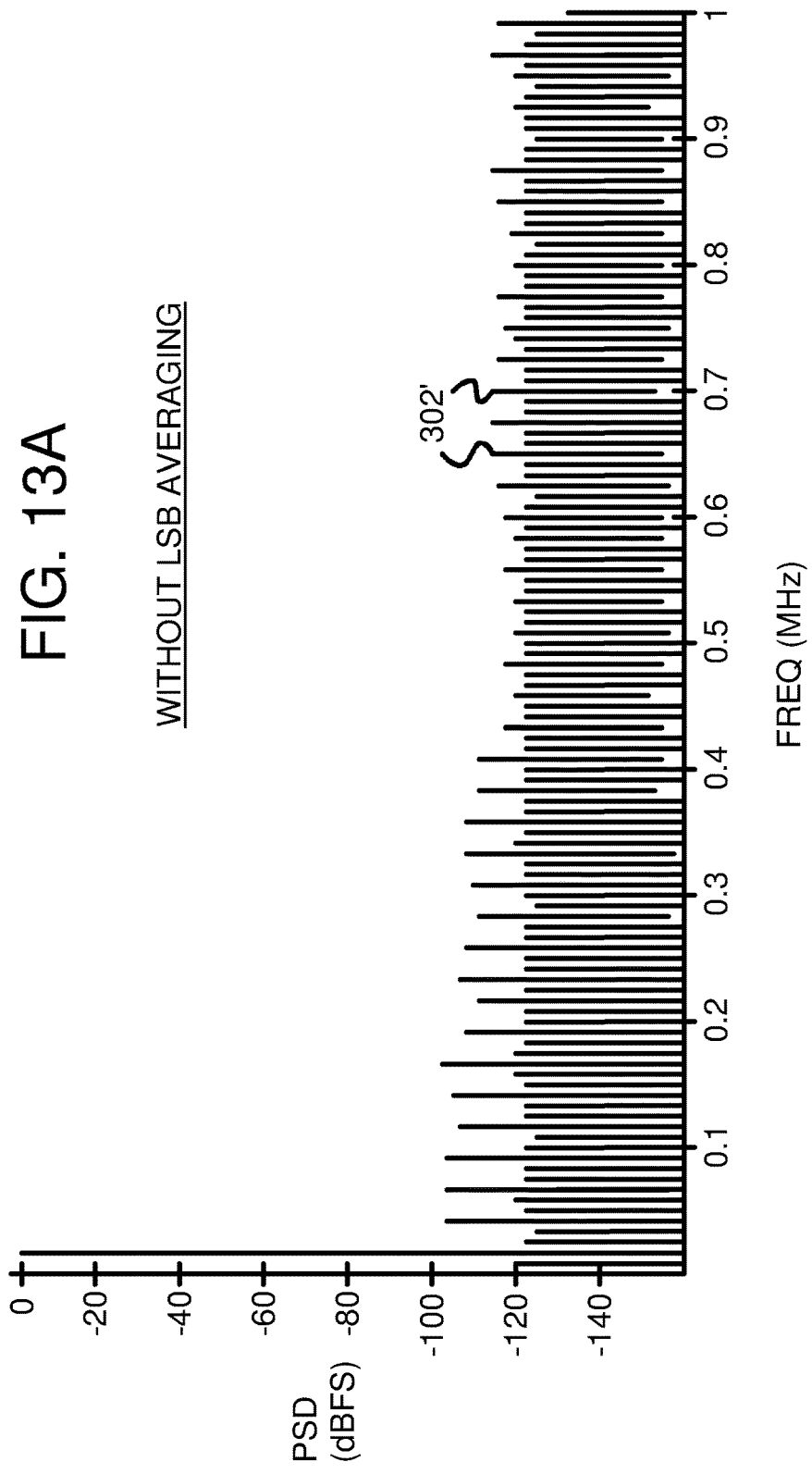

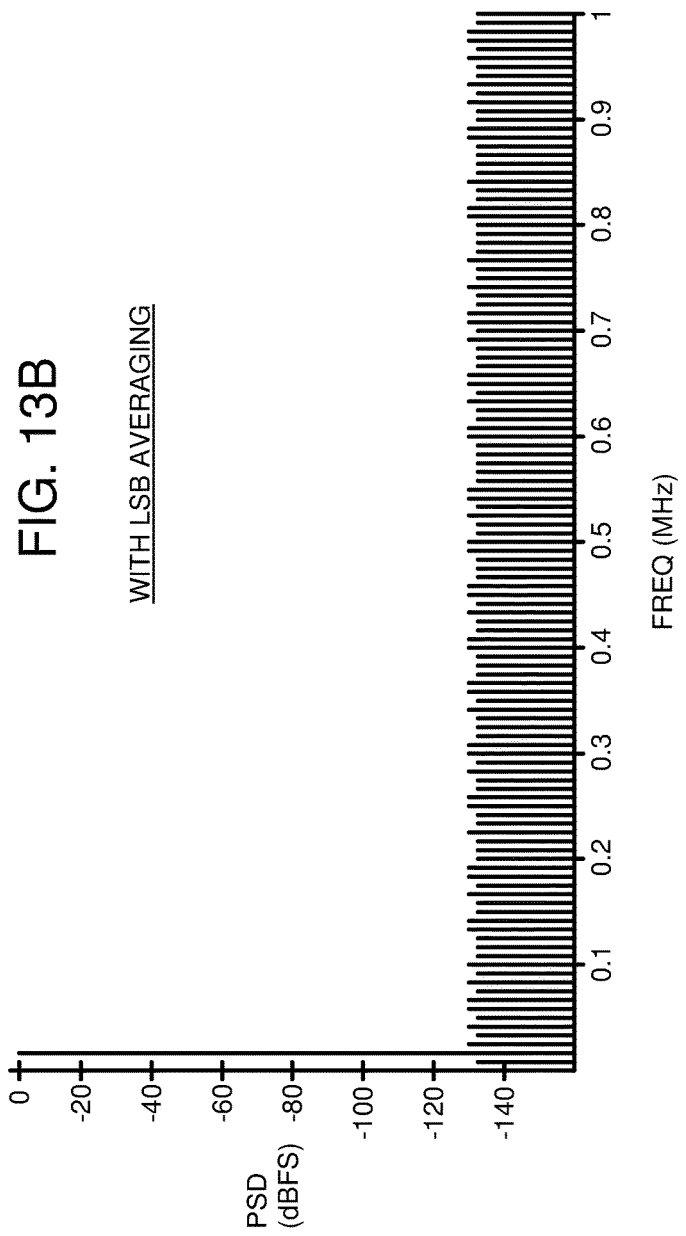

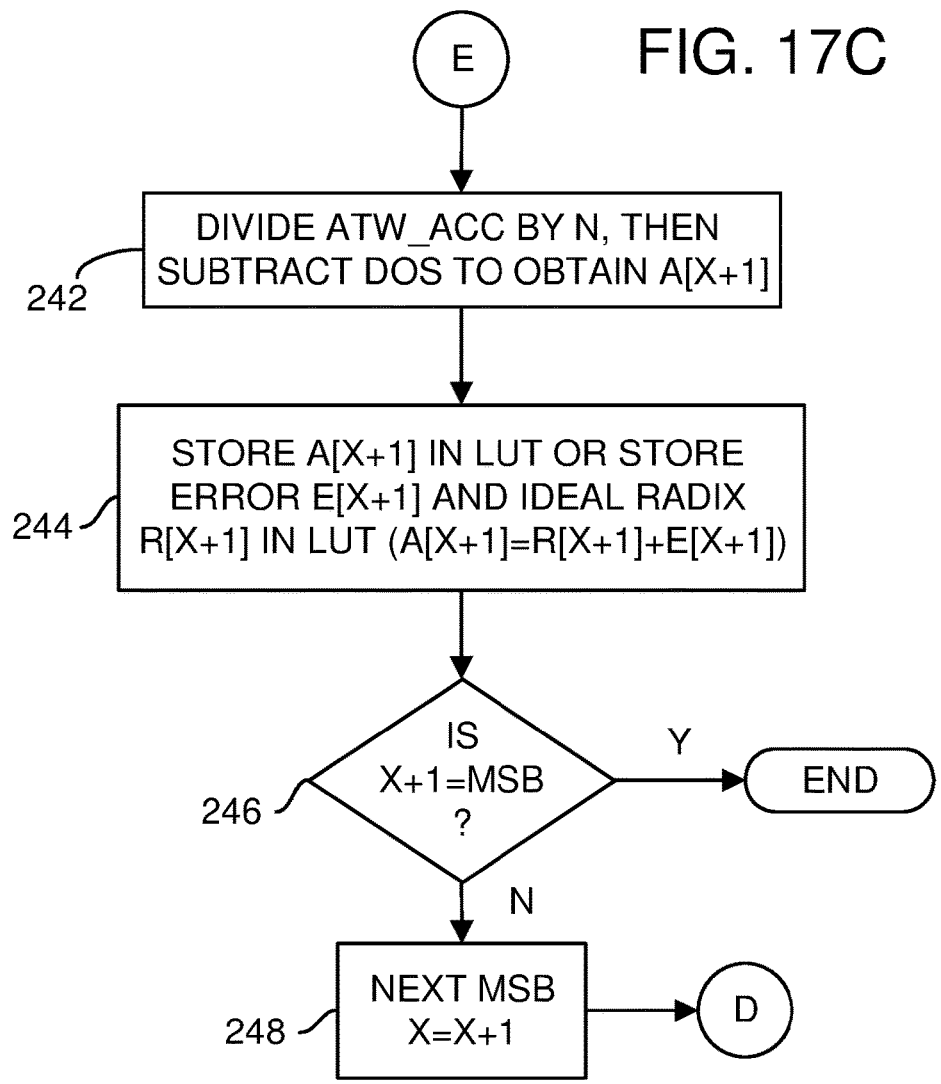

CALIBRATION OF RADIX ERRORS USING LEAST-SIGNIFICANT-BIT (LSB) AVERAGING IN A SUCCESSIVE-APPROXIMATION REGISTER ANALOG-DIGITAL CONVERTER (SAR-ADC) DURING A FULLY SELF-CALIBRATING ROUTINE

FIELD OF THE INVENTION

This invention relates to Successive-Approximation Register (SAR) Analog-to-Digital Converters (ADCs), and more particularly to calibration of a SAR ADC using Least-Significant-Bit (LSB) averaging.

BACKGROUND OF THE INVENTION

One of the most widely used circuits is the Analog-to-Digital Converter (ADC). Accuracy of the conversion from analog to digital is very important and may vary with the size of the input analog signal. These errors can be non-linear and difficult to correct.

FIG. 1A shows a prior-art ADC. Comparator 12 compares its + and − input voltages to generate a comparator output voltage VCOMP. An upper array of capacitors 14, 17, 18 is connected to the + input, while an identical lower array of capacitors 14, 16, 19 is connected to the − input. The capacitors may be binary-weighted or may have other weightings. In this example, the capacitor weights are 1, 1, 2, 3, 5, 10, 17, and 32 times a minimum or unit capacitance value C of a smallest capacitor.

Actual fabricated circuits have variations in sizes of capacitors 14, 16-19 that may cause errors during data conversion. For example, the capacitors may vary by +/−1%. For the smaller or Least-Significant-Bit (LSB) capacitors 14, the impact of this variation is relatively small and produces a tolerable error in the final result. However, for the Most-Significant-Bit (MSB) capacitors 16-19, this 1% size variation can cause a larger linearity error in the final result.

For example, capacitor 17 has a nominal value of 17C, but may have an actual value of 17.12 C. Although this 0.12C error is within the 1% tolerance, 0.12C is 12% of the LSB capacitance of 1C.

Calibration may be used to measure the actual capacitances of MSB capacitors 16-19 to compensate for these linearity errors. It can be assumed that LSB capacitors 14 have ideal weights or sufficient accuracy for the application. During a calibration routine, a Successive-Approximation Register (SAR) applies a sequence of signals to LSB capacitors 14 and VCOMP is examined to see if the SAR setting applied to LSB capacitors 14 produces a higher or lower total capacitance (and voltage swing) than capacitor 17. A reference voltage VREF is applied to capacitor 17 while lower 17C capacitor 16 is grounded. A common-mode voltage VCM such as VREF/2 is applied to both MSB capacitors 18, 19 to ignore this pair. The SAR register drives each pair of LSB capacitors 14 to 0 by applying VREF to the lower capacitor 14 and ground to the upper capacitor 14 of that pair (if VCOMP is logic 1 for this trial), or return to VCM for a 0 state. The SAR settings are tested until a closest match is found. The final SAR setting can be multiplied by the nominal capacitances of the LSB capacitors 14 that are set to 1 and summed to obtain the measured value of 17C formed by capacitors 17, 16.

During calibration, noise may occur due to various sources such as thermal noise in the circuit or system, power-supply noise, or reference-signal noise. This noise tends to be random and can occasionally cause the measured value to jump to a different value. FIG. 1B shows an idealized continuous distribution of measured values for a capacitor being calibrated many times. When the calibration of 17C formed by capacitors 16, 17 is repeated many times, a bell-shaped distribution of measured results may occur due to noise. This bell curve is centered at the actual value of 17C formed by capacitors 16, 17, such as 17.12 C in this example.

FIG. 1C shows a quantized distribution of measured values for a capacitor being calibrated many times. Since the digital results from the ADC are quantized to integer values of C, the measured results are a distribution with a large peak at 17C and a smaller peak at 18C. A weighted average of these two peaks produces the actual value of 17.12 C.

FIG. 2A shows a calibration sequence with little noise. The SAR or other logic initially drives all capacitors 14, 18, 19 to VCM while VREF is applied to 17C capacitor 17 and ground to 17C capacitor 16. Since only 17C capacitor 17 is charged, a differential voltage proportional to the +17.12 C value of 17C formed by capacitors 16, 17 is measured by comparator 12. Note that the voltages shown in FIGS. 2A-2B are idealized voltages, such as a voltage in μV when the unit capacitance C is 1 fF.

Next, the SAR drives the 10C capacitor pair 14 low by driving ground and VREF to the upper and lower 10C capacitors 14. This subtracts a differential voltage proportional to 10C. The resulting voltage +7.12 is greater than 0, so the 10C bit is set to 1 in the SAR.

Next, the SAR drives the 5C capacitor pair 14 low by driving ground and VREF to the upper and lower 5C capacitors 14. This subtracts a differential voltage proportional to 5C. The resulting voltage +2.12 is greater than 0, so the 5C bit is set to 1 in the SAR.

Next, the SAR drives the 3C capacitor pair 14 low by driving ground and VREF to the upper and lower 3C capacitors 14. This subtracts a differential voltage proportional to 3C. The resulting voltage −0.88 is less than 0, so the 3C bit is set to 0 in the SAR. The SAR drives the 3C capacitor pair to the common-mode voltage, (VCM, VCM), since VCOMP went below zero and too much was subtracted. This takes the voltage back up to +2.12.

Then the SAR drives the 2C capacitor pair 14 low by driving ground and VREF to the upper and lower 2C capacitors 14. This subtracts a differential voltage proportional to 2C, or +2.12−2=+0.12. The resulting voltage +0.12 is greater than 0, so the 2C bit is set to 1 in the SAR.

Finally, the SAR drives the 1C capacitor pair 14 low by driving ground and VREF to the upper and lower 1C capacitors 14. This subtracts a differential voltage proportional to 1C. The resulting voltage −0.88 is less than 0, so the 1C bit is set to 0 in the SAR.

The final digital code in the SAR at the end of the calibration sequence is 11010. The weights of LSB capacitors 14 are multiplied by this digital code and summed to obtain the measured value:

$$1 \times 10C + 1 \times 5C + 0 \times 3C + 1 \times 2C + 0 \times 1C = 17C.$$

FIG. 2B shows a calibration sequence with significant noise. For larger ADC's with more significant bits, the noise may be greater than the LSB. In the example of FIG. 2B, noise of −2.0 is injected when the 2C bit is being evaluated during the calibration routine. In FIG. 2A, the idealized voltage read when testing the 2C pair of LSB capacitors 14 is +0.12, but when the −2.0 noise is added the measured voltage by comparator 12 is −1.88 as shown in FIG. 2B.

Since the resulting voltage −1.88 is less than 0, the 2C bit is set to 0 in the SAR. The SAR drives the 2C capacitor pair to the common-mode voltage, (VCM, VCM), since VCOMP went below zero and too much was subtracted. This takes the voltage back up to +2.12.

Finally, the SAR drives the 1C capacitor pair 14 low by driving ground and VREF to the upper and lower 1C capacitors 14. This subtracts a voltage proportional to 1C. The resulting voltage +2.12−1=+1.12 is greater than 0, so the 1C bit is set to 1 in the SAR.

The final digital code in the SAR at the end of the calibration sequence with noise is 11001. The weights of LSB capacitors 14 are multiplied by this digital code and summed to obtain the measured value:

$$1 \times 10C + 1 \times 5C + 0 \times 3C + 0 \times 2C + 1 \times 1C = 16C.$$

The noise caused the measurement to be off by more than one significant bit, as 16C is more that 1.00 less than the actual value of 17.12 in this example. Even worse, this error can accumulate to other MSB's when they are later calibrated using the erroneous value for 17C formed by capacitors 16, 17.

FIG. 3 is a plot of the spectral density of an ADC before calibration. The decibels relative to full scale (dBFS) of the Power Spectral Density (PSD) is plotted from a Fast Fourier Transformer (FFT) of a simulation of a typical ADC before calibration. Capacitor mismatch causes spurs 302 in the spectrum. These spurs 302 are undesirable. Calibration can improve the plot and reduce the size of spurs 302 when the noise is less than a significant bit, but when the noise is greater than the LSB, spurs 302 can remain even after calibration. Many calibration methods limit ADC accuracy or conversion rate, require special input signals such as sine or triangular waves, are complex and require a large chip area and power, with a higher manufacturing cost. Calibration accuracy is often susceptible to system noise.

What is desired is a high-resolution ADC or Digital-to-Analog Converter (DAC) with good linearity so that the digital output closely follows the analog input, or vice-versa. It is desired to reduce spurs in the frequency domain that are caused by ratiometric error in matching digital/analog conversion elements such as capacitors in a weighted-capacitor array. It is further desired to remove the effects of noise during calibration that can inject significant errors in the calibrated capacitor ratios. It is desired to reduce such noise errors to prevent them from accumulating into higher-significance bits during calibration sequences. Calibration of a SAR-ADC in a noisy environment is desirable.

BRIEF DESCRIPTION OF THE DRAWINGS

FIG. 1A shows a prior-art ADC.

FIG. 1B shows an idealized continuous distribution of measured values for a capacitor being calibrated many times.

FIG. 1C shows a quantized distribution of measured values for a capacitor being calibrated many times.

FIG. 13A is a plot of the spectral density of an ADC after calibration but without LSB averaging.

FIG. 13B is a plot of the spectral density of an ADC after calibration with LSB averaging.

FIGS. 17A-17C show the radix error calibration routine in more detail.

DETAILED DESCRIPTION

The present invention relates to an improvement in ADC calibration. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Additional minimum-size or unit capacitors are sometimes added to the capacitor array to allow for averaging out noise during normal analog-to-digital conversion of analog input voltage signals in an ADC. The inventors recognize that added minimum-size capacitors can also be used for averaging out noise errors that occur during calibration.

Figures 2A, 2B:
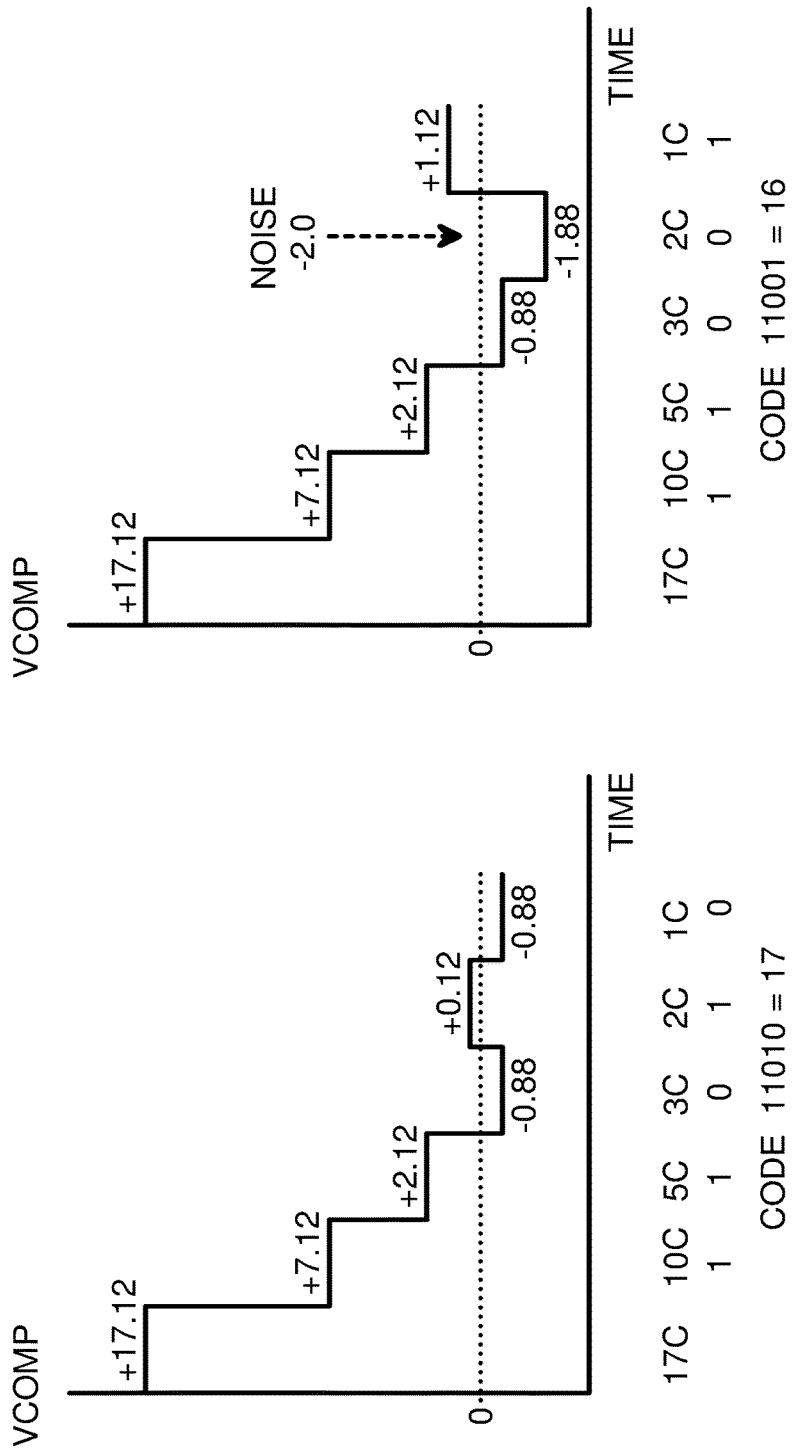
FIG. 2A shows a calibration sequence with little noise.
FIG. 2B shows a calibration sequence with significant noise.
Figure 4:
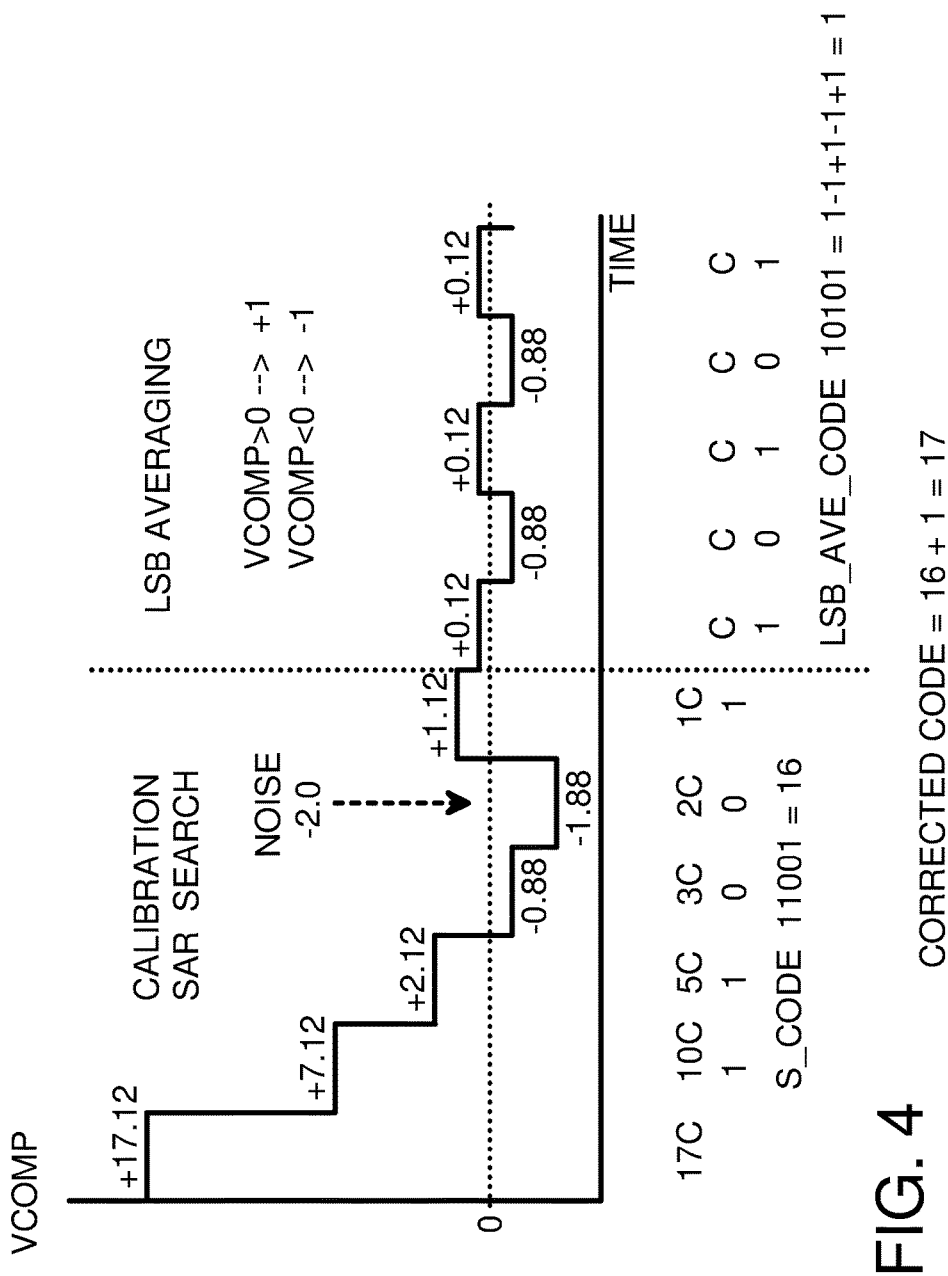
FIG. 4 shows a calibration sequence with noise that is cancelled by LSB averaging.

FIG. 4 shows a calibration sequence with noise that is cancelled by LSB averaging. The left side of FIG. 4 shows a calibration SAR search sequence with a large injected noise as described in FIG. 2B. This noise was injected during testing of the 2C capacitor 14 and overwhelmed the nominal signal from that 2C capacitor. The final 1C capacitor was also set in the opposite state to compensate for the erroneous setting of the 2C capacitor.

The SAR search code S_CODE generated with the noise was 11001, which is 16 for nominal radixes of 10, 5, 3, 2, 1. Without noise, S_CODE would be 17 about 88% of the calibration tests and 18 for the remaining 12% of the calibration tests since the actual capacitance of 17C capacitor 17 is 17.12 C.

Figure 5:
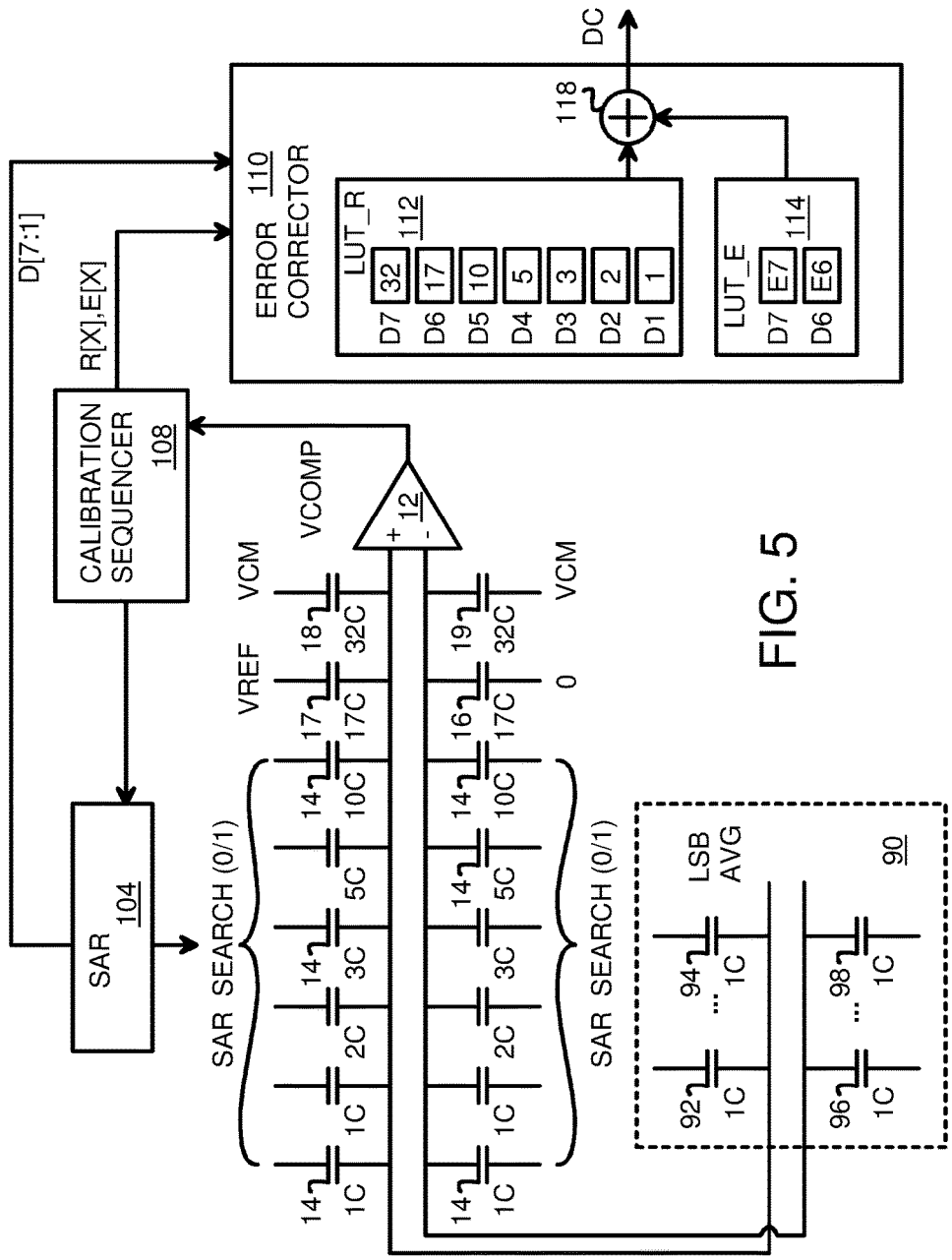
FIG. 5 is a diagram of an LSB averaging ADC with a Look-Up Table (LUT) for ideal radixes and measured errors.

An additional 5 pairs of 1C capacitors 92-98 are added to the capacitor array into comparator 12 as shown by LSB averaging array 90 (FIG. 5). These additional capacitors are LSB averaging capacitors. They are initially all connected to VCM. Once the SAR search has completed, the first pair of LSB averaging capacitors 92 is driven with ground and VREF for the upper (+) and lower (−) arrays to the + and − inputs to comparator 12, respectively. This subtracts 1 from the differential voltage on the input lines, reducing the proportional voltage from +1.12 to +0.12. Since the +0.12 is above ground, VCOMP is >0 and +1 is added to the LSB average. The first LSB capacitor pair remains at (ground, VREF).

Then the second pair of LSB averaging capacitors 92 is driven with ground, VREF, subtracting another 1.0 from the differential voltage. The result −0.88 is below ground, so VCOMP generated by comparator 12 is less than 0, and −1 is added to the LSB average. The voltages applied to the capacitors in the second LSB capacitor pair are reversed to VREF, ground. This reversal adds 2.0 to the voltage to get −0.88+2.0=+1.12.

Then the third pair of LSB averaging capacitors 92 is driven with ground, VREF, subtracting another 1.0 from the +1.12 voltage to produce +0.12, which is above ground. VCOMP is >0 and +1 is added to the LSB average. The third LSB capacitor pair remains at (ground, VREF).

Then the fourth pair of LSB averaging capacitors 92 is driven with ground, VREF, subtracting another 1.0 from the voltage. The result −0.88 is below ground, so VCOMP generated by comparator 12 is less than 0, and −1 is added to the LSB average. The voltages applied to the capacitors in the fourth LSB capacitor pair are reversed to VREF, ground. This reversal adds 2.0 to the voltage to get −0.88+2.0=+1.12.

Then the fifth pair of LSB averaging capacitors 92 is driven with ground, VREF, subtracting another 1.0 from the +1.12 voltage to produce +0.12, which is above ground. VCOMP is >0 and +1 is added to the LSB average. The fifth LSB capacitor pair remains at (ground, VREF).

The LSB averaging code LSB_AVE_CODE is obtained by summing the +1 and −1 results for all pairs of LSB averaging capacitors. In this example, LSB_AVE_CODE is +1−1+1−1+1=1. The SAR search code S_CODE is corrected by adding S_CODE to LSB_AVG_CODE, or 16+1, which is 17. This LSB averaging corrected the SAR search code that was corrupted by the injected noise.

LSB averaging reduces the distribution of noise from as much as +/−6 LSB to below +/−2 LSB, for 3 sigma probabilities.

FIG. 5 is a diagram of an LSB averaging ADC with a Look-Up Table (LUT) for ideal radixes and measured errors. Additional pairs of 1C capacitors 92-98 are added by LSB averaging array 90 that connect to the + and − lines into comparator 12. These additional capacitors are LSB averaging capacitors.

In this example, 17C formed by capacitors 16, 17 is being calibrated. VREF is applied to 17C capacitor 17 and ground is applied to complementary 17C capacitor 16. Other MSB capacitors such as 32C capacitors 18, 19 are disabled and ignored at this step by applying VCM to their terminals.

SAR 104 initially sets all terminals of LSB capacitors 14 to VCM, and then applies ground and VREF to the 10C pair. Calibration sequencer 108 examines VCOMP generated by comparator 12 to determine if that bit should be high or low in SAR 104. Then the next 5C capacitor pair is tested. Testing continues until all LSB capacitors 14 have been tested and the final SAR value is obtained. This SAR search procedure is shown later in FIG. 19. Then LSB averaging array 90 is activated to perform LSB averaging to correct the final SAR value. The LSB averaging procedure is shown later in FIG. 18.

This entire process is repeated many times and an average SAR value obtained by averaging these LSB-corrected final SAR values. While each individual final SAR value will be an integer, the average will also have a fractional or decimal part, such as 0.12 for the 17C capacitor 17 example that has an actual value of 17.12 C.

The ideal ratio to the unit capacitance, or radix, is calculated and stored in error corrector 110 as R[X]. For 17C capacitor 17, the ideal radix is 17, which is loaded into location D6 of radix LUT 112. For 32C capacitor 17, the ideal radix is 32, which is loaded into location D7 of ideal radix LUT 112. The ideal radixes for 10C, 5C, 3C, 2C, and 1C LSB capacitors 14 are loaded into locations D5 to D1 of ideal radix LUT 112, as stored values 10, 5, 3, 2, and 1.

The LSB capacitors 14 are assumed to have negligible error, so no error values are stored for them in radix error LUT 114. However, the MSB capacitors 17, 18 have measurable errors that are stored as E7 for 32C formed by capacitors 18, 19, and as E6 for 17C formed by capacitors 16, 17. These errors are the difference between the average of the SAR values and the ideal radix for that capacitor pair.

Calibration sequencer 108 averages all the final SAR results to obtain the average of the SAR values. Calibration sequencer 108 subtracts the calculated ideal radix R[X] stored in ideal radix LUT 112 from this average of the SAR values to obtain the error E[X] that is stored in radix error LUT 114.

During normal ADC operation after calibration is completed, error corrector 110 is activated. Adder 118 adds the ideal radix read from ideal radix LUT 112 to the error E[X] read from radix error LUT 114 to obtain the corrected radix. After the SAR search during conversion of the analog voltage, the corrected radix for all 1 bits in digital SAR result D[7:1] from SAR 104 are added together to obtain the corrected digital value DC for the analog voltage converted.

Figure 6:
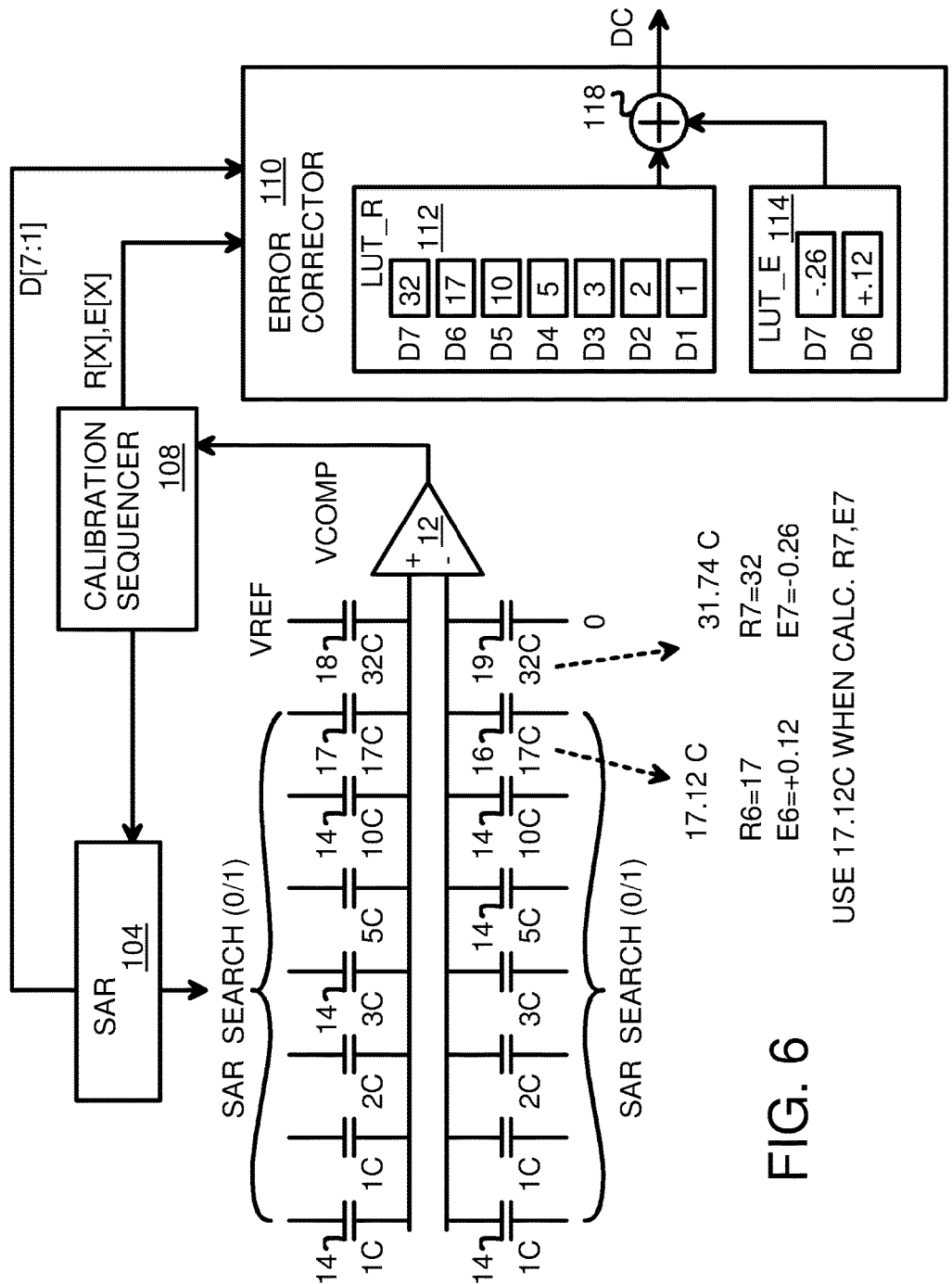
FIG. 6 highlights generation of measured errors and ideal radixes during calibration.

FIG. 6 highlights generation of measured errors and ideal radixes during calibration. 17C formed by capacitors 16, 17 has an actual value of 17.12 C, so calibration sequencer 108 determines after averaging many final SAR values that the error E6 is +0.12 and the ideal radix R6 was calculated as 17. The measured E6 value of +0.12 is loaded into radix error LUT 114 for bit D6.

Once 17C formed by capacitors 16, 17 has been calibrated, then next MSB capacitor, 32C formed by capacitors 18, 19, is calibrated in the same manner. VREF is applied to 32C capacitor 18 and ground is applied to complementary 32C capacitor 19. 17C capacitor 17 and complementary 17C capacitor 16 are now included in the expanded SAR search. Once the search completes, and LSB averaging has corrected the result, SAR 104 stores the digital code D[7:1] for the measured capacitance of 32C formed by capacitors 18, 19.

This digital code D[7:1] is converted to a measured capacitance for 32C capacitors 18, 19 by reading the ideal radix R[X] and its error E[X] for each bit X in digital code D[7:1] that is a 1 in SAR 104, and then summing them. For bits D5 to D1, the errors are zero, but for D6 the error E[6] is 0.12, which is used to calculate the error E[7] for 32C formed by capacitors 18, 19.

For example, the final SAR value may be 111000, which has a 1 bit for the 17C, 10C, and 5C capacitors. However, 17C capacitor 17 has an actual value of 17.12, not 17, so this final SAR value corresponds to:

17.12+10+5=32.12

On another repetition of the SAR search, the final SAR value is 110101, which has a 1 bit for the 17C, 10C, 3C, and 1C capacitors. Since 17C capacitor 17 has an actual value of 17.12, not 17, so this final SAR value corresponds to:

17.12+10+3+1=31.12

These calculated actual values are stored and averaged over many repetitions of the SAR search procedure to obtain the average SAR result. In this example, the average of the SAR results was 31.74, while the calculated ideal radix was 32. The ideal value of 32 is stored as R7 in ideal radix LUT 112, while the error of −0.26 is stored as the error E7 in radix error LUT 114.

Using the actual value for 17C formed by capacitors 16, 17, including the measured error, rather than the ideal radix, prevents errors from propagating to more significant bits during calibration. If there were any more MSBs above 32C formed by capacitors 18, 19, then these would use the actual measured error E7 for 32C formed by capacitors 18, 19 as well as its ideal radix R7.

Figure 7:
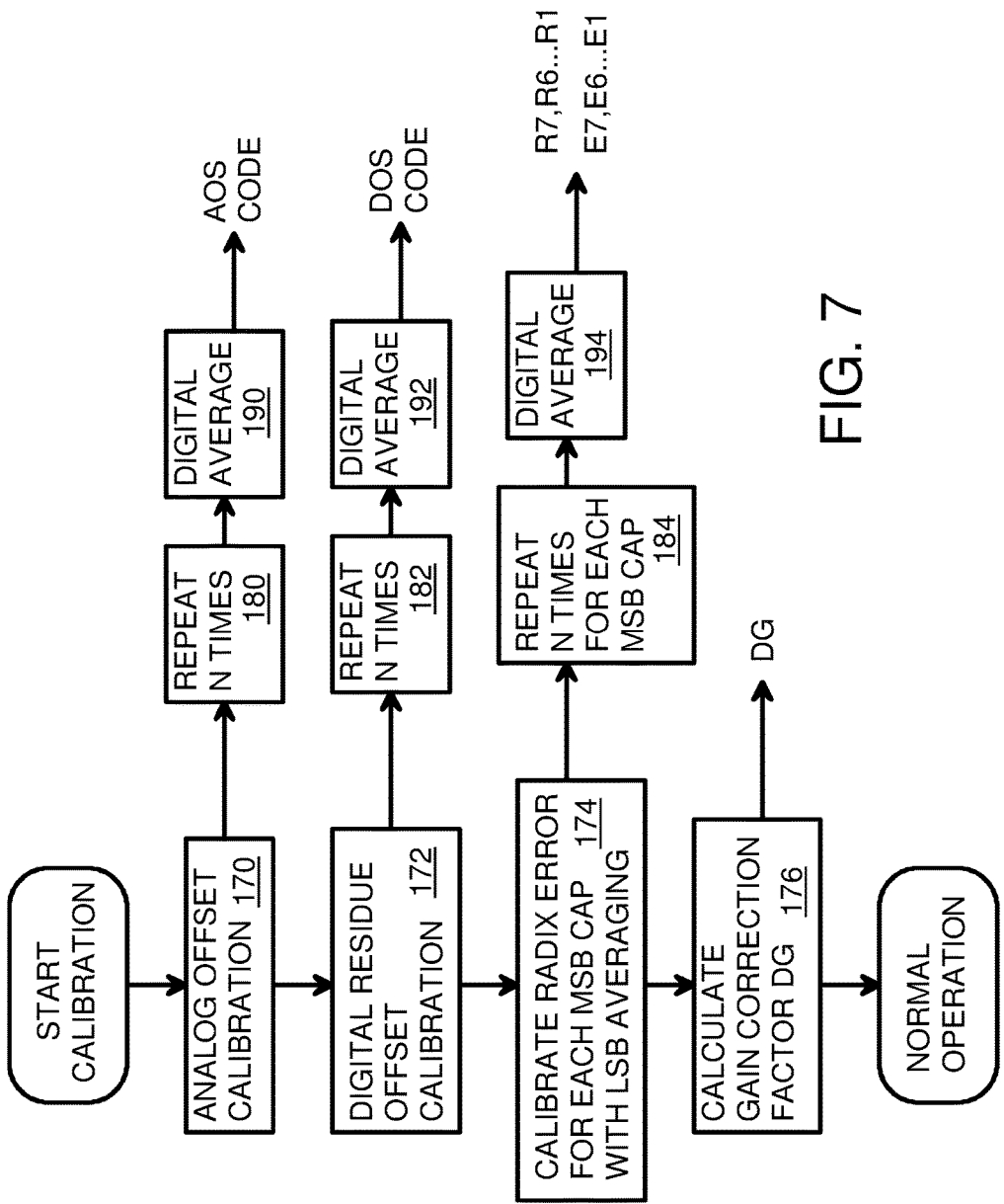
FIG. 7 is an overall flowchart of a self-calibrating routine that includes both analog and digital calibration.

FIG. 7 is an overall flowchart of a self-calibrating routine that includes both analog and digital calibration. Errors are reduced by extensive averaging, both digital averaging of SAR search result values, and analog averaging using LSB averaging capacitors.

Figure 8:
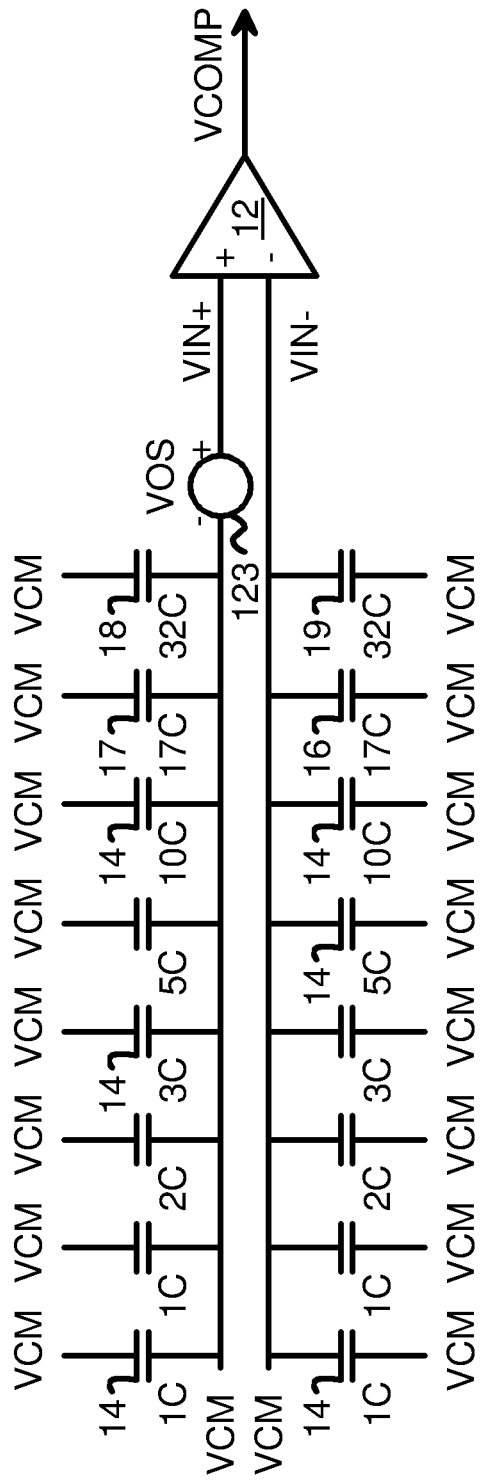
FIG. 8 highlights analog offset calibration.
Figure 9:
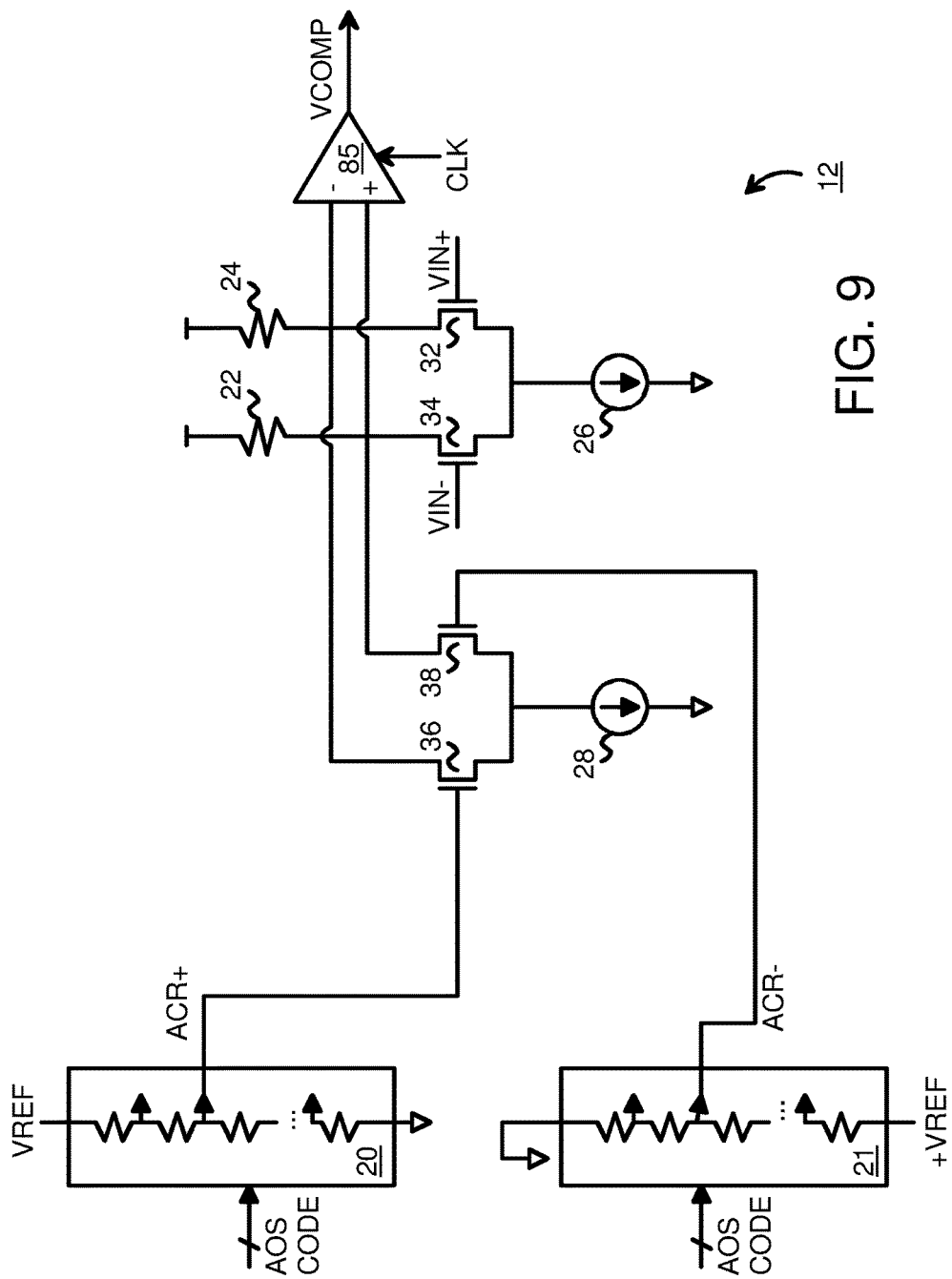
FIG. 9 shows the comparator with analog offset correction circuitry.
Figure 15:
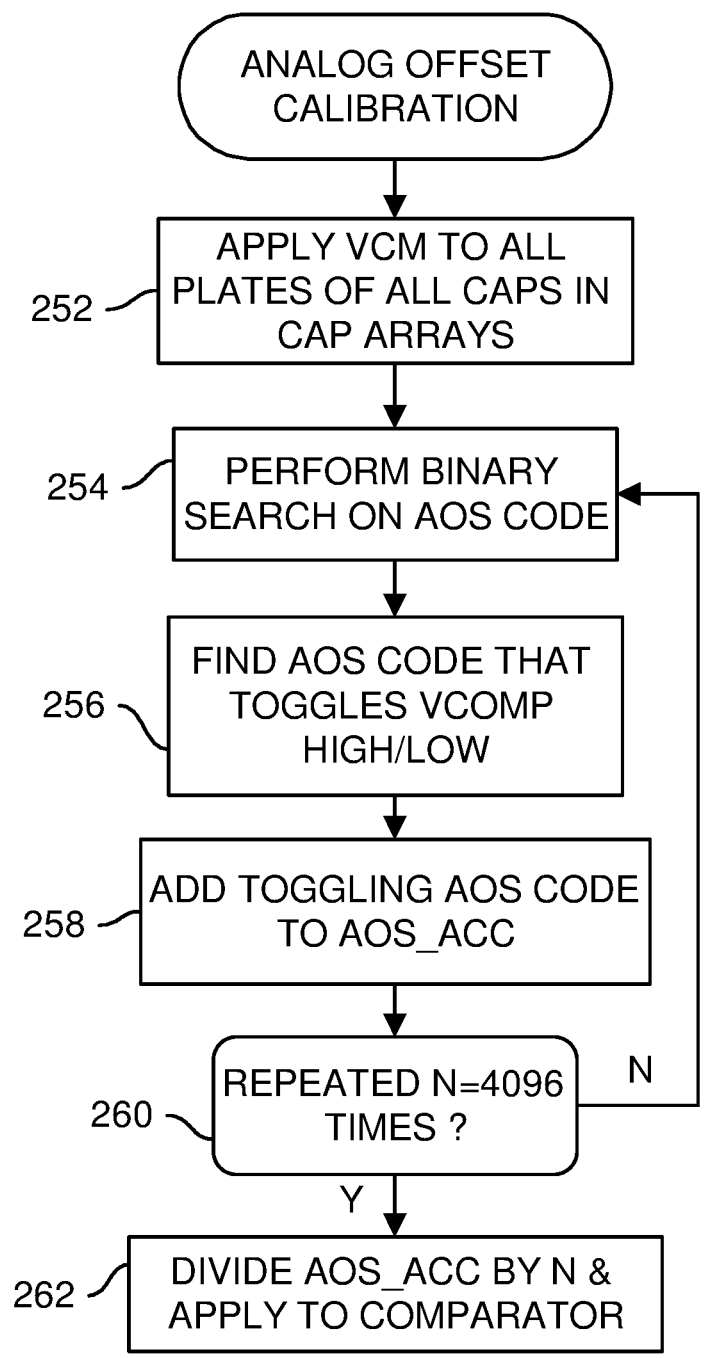
FIG. 15 shows the analog offset calibration routine.

After calibration is initiated, analog offset calibration 170 is performed, as shown in FIGS. 8, 9, 15. Analog offset calibration 170 is performed to correct an analog offset voltage in comparator 12. Analog offset calibration 170 is repeated N times, step 180, and a digital average of the N results is obtained, step 190. Analog offset calibration 170 generates a digital value, the Analog Offset code (AOS), that is applied to a digitally-controlled variable voltage divider to generate an offset voltage applied to comparator 12. The final digital average of the AOS code is applied to comparator 12 for all further testing and for normal ADC operation.

Digital residue offset calibration 172 measures a remaining offset that is the residue after the AOS code is applied to correct the analog offset detected by analog offset calibration 170. Digital residue offset calibration 172 calibrates the largest of capacitors 14 that are considered to have zero error, and thus have no measured error entry in radix error LUT 114. Digital residue offset calibration 172 performs a SAR search on the remaining LSB capacitors to measure the residue error. Digital residue offset calibration 172 also performs LSB averaging using LSB averaging array 90. Digital residue offset calibration 172 is also repeated N times, step 182, and the digital average of the N results is obtained, step 192. Digital residue offset calibration 172 produces a digital code, the Digital Offset code (DOS). Digital residue offset calibration 172 is described in more detail in FIGS. 10, 11, 16A-16C.

Radix error calibration 174 is performed for each MSB capacitor pair, 16 17, and 18, 19 . . . to generate the ideal radix and the measured error for each MSB capacitor. LSB averaging is performed at the end of each SAR search using LSB averaging array 90 for each measurement. Radix error calibration 174 is also repeated N times, step 184, and the digital average obtained, step 194, for each MSB capacitor pair. The digital averaged results are stored as ideal radixes R[X] in ideal radix LUT 112 and as measured errors E[X] in radix error LUT 114.

The gain correction factor, DG, is calculated, step 176, to scale or normalize the results to fit a specified range. Normal operation such as conversions of analog voltages to digital values can be performed once all calibrations are completed.

FIG. 8 highlights analog offset calibration. An analog offset voltage, VOS 123, is present in comparator 12. VOS 123 can be measured when all LSB capacitors 14 and MSB capacitors 16, 17, 18, 19 have all their terminals connected to VCM. The output of comparator 12, VCOMP, is not exactly zero even when all capacitors are disabled by VCM.

FIG. 9 shows the comparator with analog offset correction circuitry. Comparator 12 has differential pair of n-channel transistors 32, 34 that have gates that receive comparator inputs VIN+ and VIN−, respectively, that are connected to the capacitors. Current source 26 is connected to the sources of both of n-channel transistors 32, 34, while load resistor 22 connects to the drain of n-channel transistor 34, while load resistor 24 connects to the drain of n-channel transistor 32 and to differential latch 85, which generates comparator output VCOMP. Differential latch 85 may convert VCOMP>0 to a binary 1 output and VCOMP<0 to a binary 0 output.

The drain of differential n-channel transistor 32 is also connected to the drain of adjusting n-channel transistor 36, which has a gate driven by voltage ACR+ generated by first variable voltage divider 20. The drain of differential n-channel transistor 34 connects to the drain of adjusting n-channel transistor 38. Adjusting n-channel transistor 38 has a gate driven by voltage ACR-generated by second variable voltage divider 21. The sources of adjusting n-channel transistors 36, 38 are connected together and to current source 28. Adjusting n-channel transistors 36, 38 can be a fraction of the size of differential n-channel transistors 32, 34, such as $\frac{1}{10}$, $\frac{1}{20}$, or some other ratio, to reduce the equivalent fractional voltage for adjustment of VOS to comparator 12.

A digital code, the AOS code, is input to first variable voltage divider 20 and to second variable voltage divider 21. This AOS code controls a mux or switches in variable voltage dividers 20, 21 to select for output a tap between adjacent resistors in a series of resistors between two analog input voltages within each of variable voltage divider 20, 21. However, the analog input voltages, VREF and ground, applied to variable voltage divider 20 are connected in reverse for variable voltage divider 21, so that when the AOS code increases, causing ACR+ generated by first variable voltage divider 20 to rise, ACR− generated by second variable voltage divider 21 falls by a same amount. Thus ACR+ and ACR− are complementary.

The difference between ACR+ and ACR− adjust the current steered by adjusting n-channel transistors 36, 38 to alter VCOMP. When VIN+ and VIN− are equal to each other, such as when capacitors 14, 16-19 are all driven by VCM, as shown in FIG. 8, then adjusting ACR+ and ACR− to minimize the magnitude of differential output of the pre-amplifier will also compensate for the analog offset, VOS 123.

During analog offset calibration 170, a binary search is performed on the AOS code to find an AOS value that minimizes the output voltage of the pre-amplifier. This AOS value is used for other calibration routines and for normal ADC operation.

Figure 10:
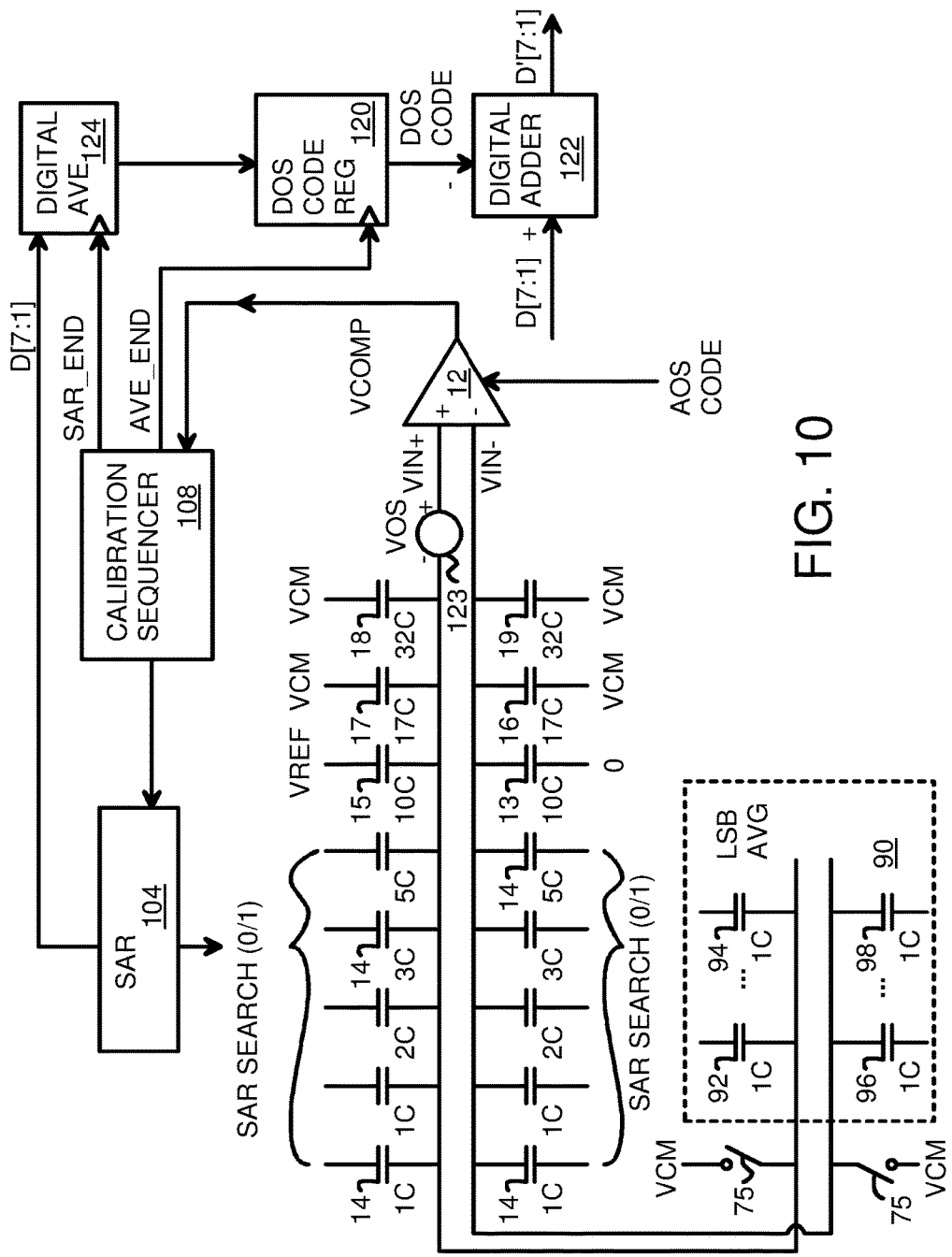
FIG. 10 illustrates digital residue offset calibration using LSB averaging.

FIG. 10 illustrates digital residue offset calibration using LSB averaging. Analog offset calibration 170 is performed before digital residue offset calibration 172, and the AOS code obtained from analog offset calibration 170 is applied to comparator 12 to offset most of analog offset VOS 123. MSB capacitors 16-19, such as for 17C, 32C, and any higher (not shown) have their terminals connected to VCM to disable them from affecting VCOMP. Switches 75 drive the inner plates of all capacitors 14-19 and 92-98 to VCM to initialize the capacitor array.

The largest of the LSB capacitors 14, upper 10C capacitor 15, is connected to VREF, while its complement, lower 10C capacitor 13, is grounded. This (VREF, ground) connection of 10C capacitors 15, 13 causes a differential voltage onto the inputs to comparator 12 that is proportional to the actual 10C capacitance formed by upper 10C capacitor 15 and lower 10C capacitor 13.

Calibration sequencer 108 initially drives all of LSB capacitors 14 to VCM, and then causes SAR 104 to apply (ground, VREF) to successively smaller pairs of LSB capacitors 14 to perform a SAR search routine, such as described later in FIG. 19. At the end of each SAR search routine, LSB averaging array 90 is used to perform LSB averaging, such as described in more detail in FIG. 18. LSB averaging reduces the distribution of noise from as much as +/−6 LSB to below +/−2 LSB, for 3 sigma probabilities.

After the end of each SAR search, after the SAR code result has been corrected by LSB averaging using LSB averaging array 90, the LSB-corrected SAR code D[4:1] is latched into digital averager 124 and accumulated with all earlier results. Calibration sequencer 108 can send a SAR_END signal to digital averager 124 to latch in and accumulate the latest result from SAR 104.

The SAR searches and LSB averaging are repeated and accumulated N times. Then digital averager 124 divides the accumulated results by N to obtain a digital average. This digital average has both an integer and a fractional or decimal part. Calibration sequencer 108 then latches the digital average from digital averager 124 into DOS code register 120. Digital residue offset calibration is then completed.

The repetition factor N can be set to a large value, such as 4096, to filter out noise and other random errors that occur during calibration. The digital residue offset calibration routine is described in more detail in FIGS. 16A-16C.

During normal operation of the ADC when analog voltages are converted to digital values, digital adder 122 subtracts the DOS code from DOS code register 120 from the converted digital code to obtain a DOS-corrected digital code.

Figure 11:
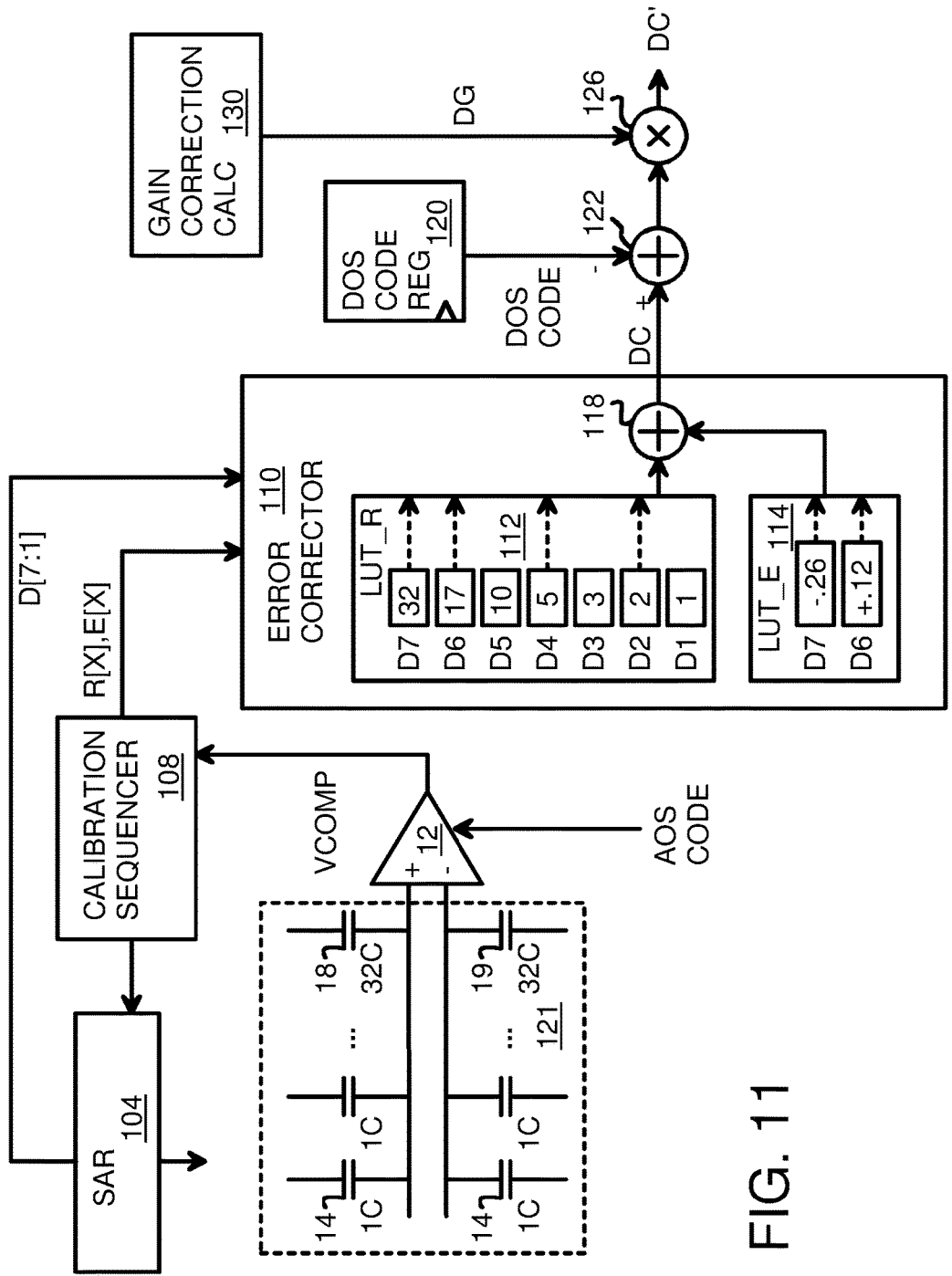
FIG. 11 shows DOS corrections applied during normal ADC conversions using the ideal radixes and measured errors stored in the LUT during calibration.

FIG. 11 shows DOS corrections applied during normal ADC conversions using the ideal radixes and measured errors stored in the LUT during calibration. During normal ADC conversions, an analog input voltage is applied to capacitor array 121 and calibration sequencer 108 controls SAR 104 to apply test voltages to LSB capacitors 14 and MSB capacitors 18, 19 during SAR searches. The final SAR code D[7:1] is used to lookup ideal radixes in ideal radix LUT 112 and measured errors in radix error LUT 114, which were previously loaded into the LUT during calibration. Adder 118 in error corrector 110 sums the ideal radixes and the measured errors for all bits set to 1 in final SAR code D[7:1] to obtain the radix-corrected digital code DC.

Then digital adder 122 subtracts the DOS code stored in DOS code register 120 from this radix-corrected digital code DC. The difference from digital adder 122 is scaled by multiplier 126 with the gain factor DG to normalize the result to generate the final digital code result DC'.

Gain correction calculator 130 generates gain factor DG by dividing the desired range of results by the sum of the ideal radixes and measured errors. This can be expressed by the formula:

$$64/(\text{sum}(R[i])+\text{sum}(E[i])) \text{ for } i=1,\ldots 7$$

where R denotes the ideal radixes, and E denotes the measured errors.

In this example, $$DG=64/(32+17+10+5+3+2+1-0.26+0.12)$$

Figure 12:
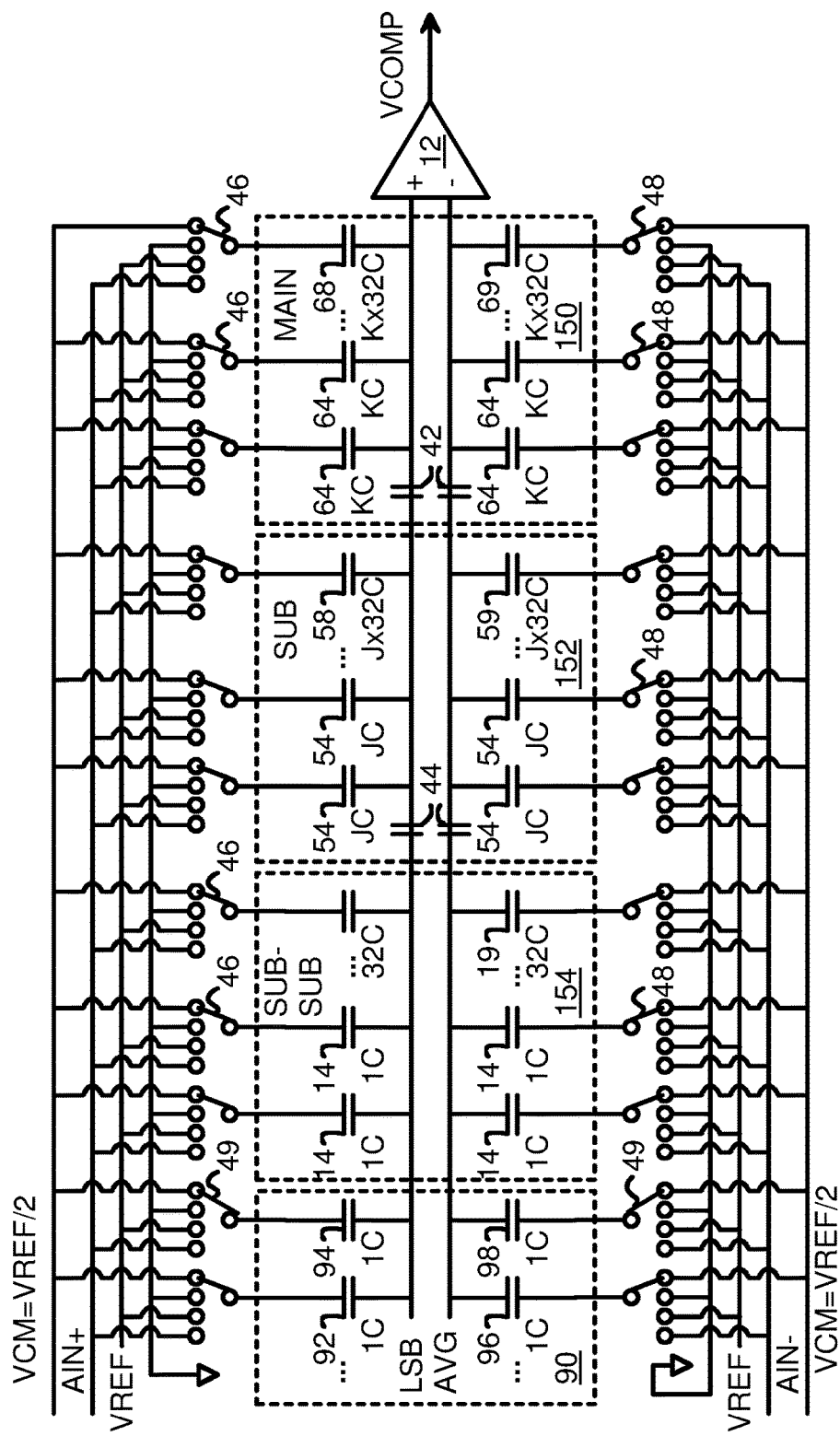
FIG. 12 is a schematic showing more details of the capacitor arrays.

FIG. 12 is a schematic showing more details of the capacitor arrays in a high-resolution SAR-ADC. The terminals of the upper capacitors can be switched by upper switches 46 to any one of four voltages: common mode VCM, which can be generated as half of VREF, VREF, ground, or the positive analog input voltage AIN+. The terminals of the lower capacitors can be switched by switches 48 to VCM, VREF, ground, and AIN−. During normal conversions, the differential analog input signal AIN+, AIN− may be switched to selected ones of the capacitors during different phases of the conversion routine. Various conversion routines may be used. Switches 75 (not shown, see FIG. 10) are added to each of the three pairs of segments of the lines to comparator 12 that are separated by attenuating capacitors 42, 44. Switches 75 (not shown) drive the inner plates of all capacitors to VCM to initialize the capacitor arrays.

LSB averaging is performed by LSB averaging array 90. Switches 49 initially connect VCM to all LSB averaging capacitors 92-98, then switch VREF and ground to successive capacitor pairs. LSB averaging array 90 may be used only during calibration, or also during normal conversions.

In the simplest embodiment, LSB averaging capacitors 92-98 have the same unit capacitance as the smallest capacitors 14 in sub-sub array 154. Sub-sub array 154 has capacitors of values 1C, 1C, 2C, 3C, 5C, 10C, 17C, and 32C.

Attenuating capacitors 44 separate sub-sub array 154 from sub array 152, while attenuating capacitors 42 separate sub array 152 from main array 150. Attenuating capacitors 42, 44 are placed on the lines into the + and − inputs of comparator 12, and their series connection causes a decrease in signal strength or attenuation that is proportional to the capacitive coupling ratio. The capacitive coupling ratio is computed from the attenuating capacitor and equivalent capacitances to the input to comparator 12. In practice, the attenuation and capacitive coupling ratio can be obtained or checked by circuit simulation.

In this example, attenuating capacitors 42, 44 cause unit capacitors 64 in main array 150 to be K times larger than 1C unit capacitors 14 in sub-sub array 154 when both of unit capacitors 64, 14 have the same physical size, such as 1C. The largest 32C capacitors 68, 69 will have the value K*32C, and other intermediate size capacitors in main array 150 will have an ideal radix that is K times larger than the physical size would indicate.

Likewise, attenuating capacitors 44 cause unit capacitors 54 in sub array 152 to be J times larger than 1C unit capacitors 14 in sub-sub array 154 when both of unit capacitors 54, 14 have the same physical size, such as 1C. The largest 32C capacitors 58, 59 will have the value J*32C, and other intermediate size capacitors in sub array 152 will have an ideal radix that is J times larger than the physical size would indicate. K will be larger than J by some factor caused by attenuating capacitors 42.

During circuit design, the sizes of attenuating capacitors 42, 44 relative to unit capacitors 14, 54, 64 can be determined and the attenuation factors J, K calculated and later checked by simulation. These attenuation factors J, K are multiplied by the nominal capacitor sizes to obtain the ideal radixes R[X]. For example, capacitors 14, 19 in sub-sub array 154 have ideal radixes R[X] that are the same as their number of unit capacitances, or 1, 1, 2, 3, 5, 10, 17, 32. When sub array 152 has the same physical sizes of capacitors 54, 58, 59 as does sub-sub array 154, then sub array 152 has ideal radixes R[X] of J, J, 2J, 3J, 5J, 10J, 17J, 32J.

J and K can be expresses as positive numbers greater than 1, such as J=63.5 and K=4063.0, in one example. The largest 32C capacitor 68 in main array 150 would have an ideal radix R21 of 32×4063=130016, while the largest 32C capacitor 58 in sub array 152 would have an ideal radix R14 of 32×63.5=2032. Sub-sub array 154 has radixes R1 to R7, sub array 152 has radixes R8 to R14, and main array 150 has radixes R15 to R21. These ideal radixes R1 to R21 are stored in ideal radix LUT 112.

When main array 150 also has the same physical sizes of capacitors 64, 68, 69 as does sub-sub array 154, then main array 150 has ideal radixes R[X] of K, K, 2K, 3K, 5K, 10K, 17K, 32K. Main array 150 connects directly to the +,− inputs of comparator 12 and thus has the Most-Significant-Bits (MSBs), having no attenuation from attenuating capacitors 42, 44. Sub-sub array 154 receives attenuation from both attenuating capacitors 42, 44, and has the most attenuation and thus its capacitors have the weakest effect on comparator 12 and are the Least-Significant-Bits (LSBs).

In this 21-bit ADC example of FIG. 12, with 18 effective bits, it might be assumed that the lower 7 bits are all ideal with zero errors E1 to E7. Then radix error calibration can be performed on the upper 14 bits to obtain R8 to R21 and E8 to E21. R1 to R21 can be pre-calculated using J and K and then stored into ideal radix LUT 112. Then during radix error calibration, the final digitally-averaged LSB-corrected SAR search result is subtracted from the ideal radix R[X] to obtain the measured error E[X] to store into radix error LUT 114.

FIG. 13A is a plot of the spectral density of an ADC after calibration but without LSB averaging. The decibels relative to full scale (dBFS) of the Power Spectral Density (PSD) is plotted from a Fast Fourier Transformer (FFT) of a simulation of the ADC of FIG. 12 after calibration, but with LSB averaging disabled.

Figure 3:
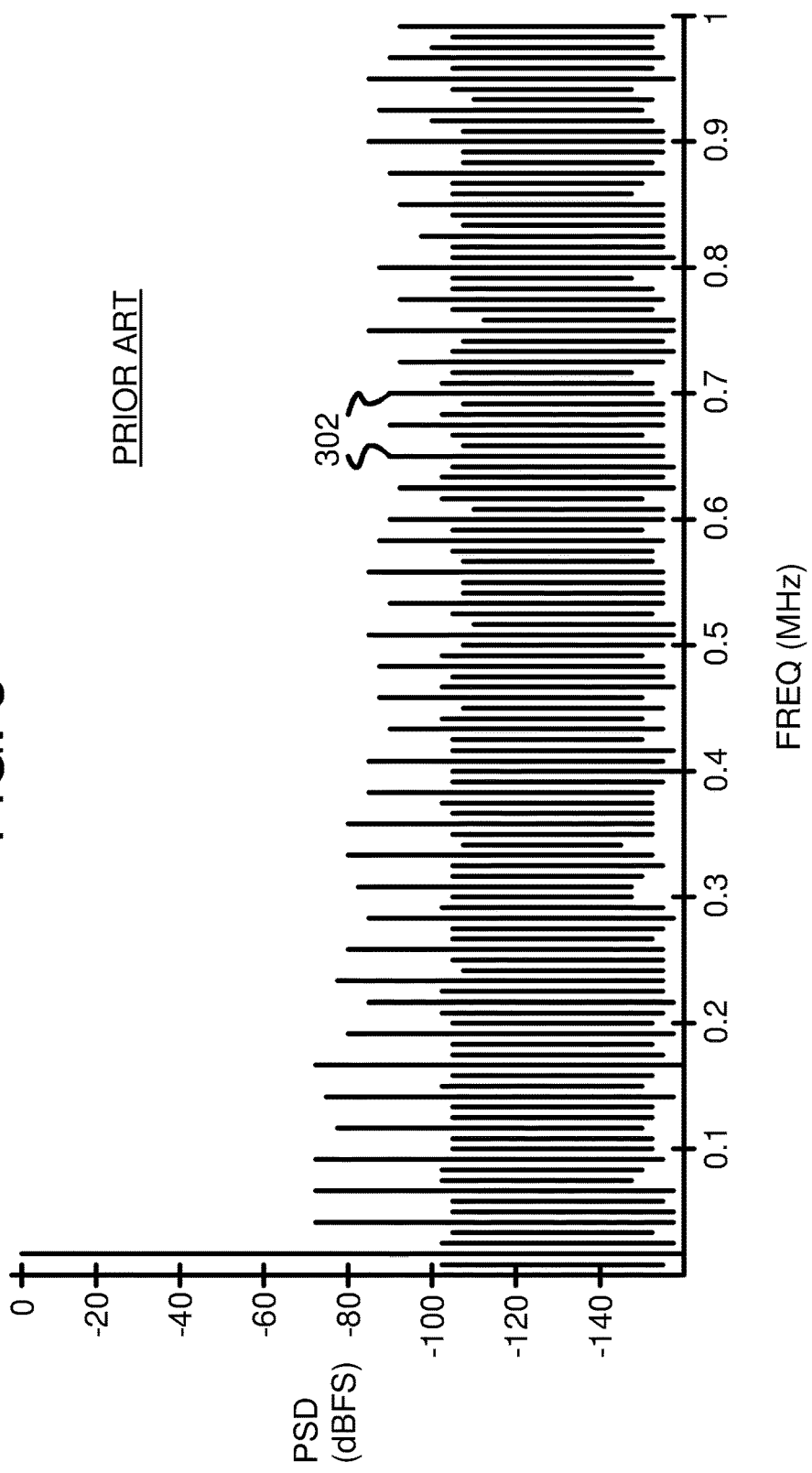
FIG. 3 is a plot of the spectral density of an ADC before calibration.

Circuit noise still is present to cause spurs 302' in the spectrum. While these spurs 302' have decreased in magnitude compared to the uncalibrated spectrum of FIG. 3, they are still present and are undesirable. The average signal has improved from about −105 dB to about −120 dB.

FIG. 13B is a plot of the spectral density of an ADC after calibration with LSB averaging. Using LSB averaging causes spurs 302' in FIG. 13A to disappear. The average signal has improved further to about −130 dB. Thus LSB averaging is effective in reducing or eliminating quantization noise and spurs.

Figure 14:
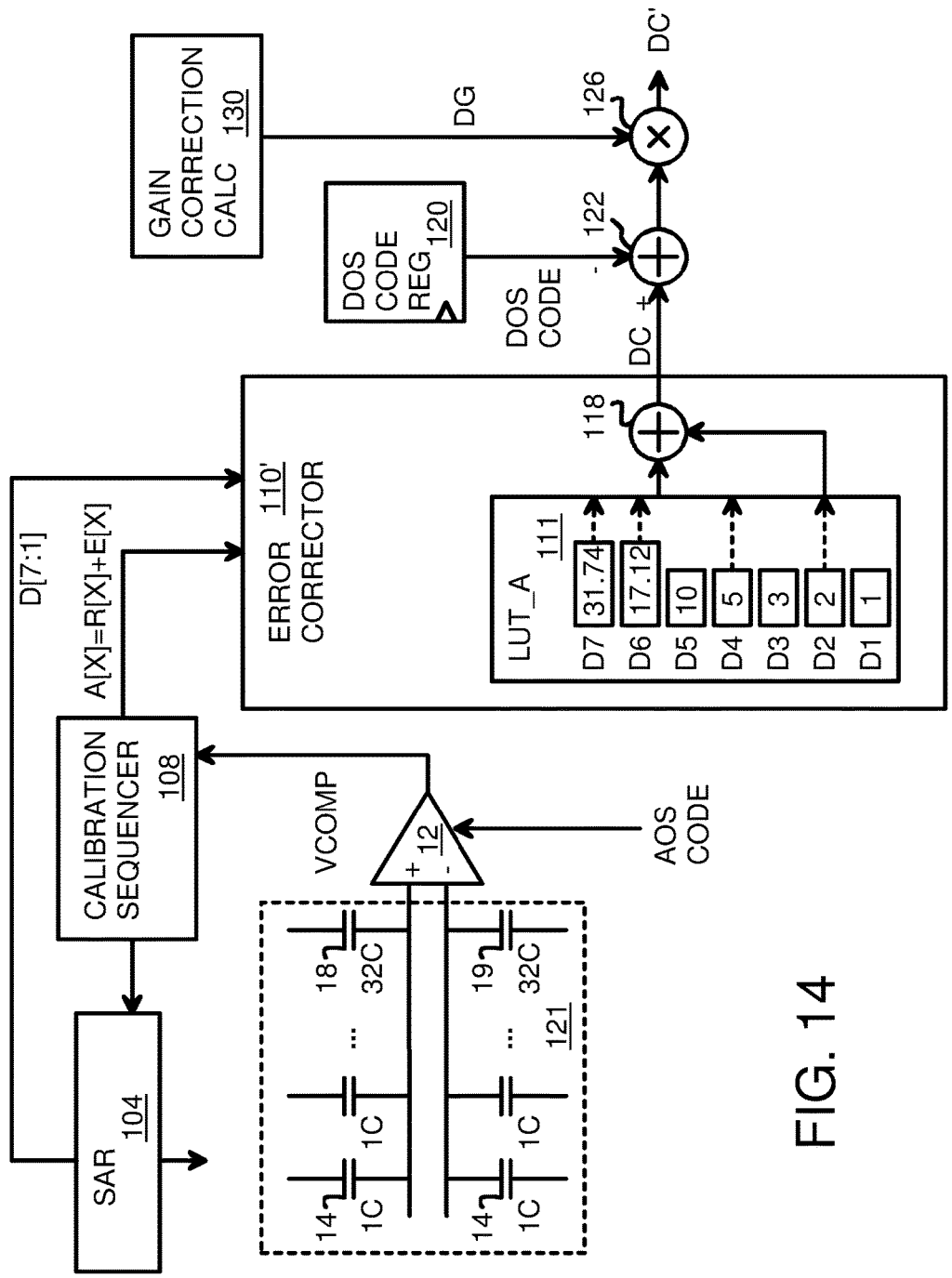
FIG. 14 shows using a single LUT that stores the actual radixes that include the errors measured during radix error calibration.

FIG. 14 shows using a single LUT that stores the actual radixes that include the errors measured during radix error calibration. In this variation, error corrector 110' receives a single value rather than two values for each radix. Calibration sequencer 108 calculates the actual measured radix A[X], which is the sum of the ideal radix R[X] and the measured error E[X]. Then the actual measured radix A[X] is stored in actual radix LUT 111. During initialization, actual radix LUT 111 can be loaded with the ideal radixes that are calculated from attenuation factors J, K and the capacitor sizes, and then later the ideal radixes are replaced by the actual measured radix A[X] values as they are generated during radix error calibration.

FIG. 15 shows the analog offset calibration routine. Analog offset calibration 170 is performed first in the calibration sequence of FIG. 7. The common-mode voltage VCM is applied to all plates of all capacitors in all capacitor arrays, step 252. This includes LSB averaging array 90, main array 150, sub array 152, and sub-sub array 154 in FIG. 12. In this setting, all of the capacitors are neutrally balanced and do not affect the input voltages to comparator 12. A binary search is performed on the AOS code, step 254, and this AOS code is applied to first variable voltage divider 20 and to second variable voltage divider 21 to adjust the adjusting voltage applied to transistors 36, 38 (FIG. 9) inside comparator 12. As different values of the AOS code are tested during the binary search, the VCOMP output of comparator 12 is examined. At the completion of the binary search, when all AOS bits have been tested, the precise value of AOS that causes VCOMP to toggle in polarity is obtained, step 256.

This AOS value that causes VCOMP to toggle is accumulated into the AOS accumulator, step 258. Then the binary search is repeated, step 254, and another result accumulated, step 258, until the repeat factor N of results have been accumulated, step 260. N can be a large value, such as 4096, to reduce the effects of noise and random errors. Then the accumulated value of the AOS codes in the AOS accumulator is divided by N, step 262, to obtain the final digitally-averaged AOS code. This final AOS code is applied to first variable voltage divider 20 and to second variable voltage divider 21 for all further calibration and during normal ADC operation.

Figure 16A:
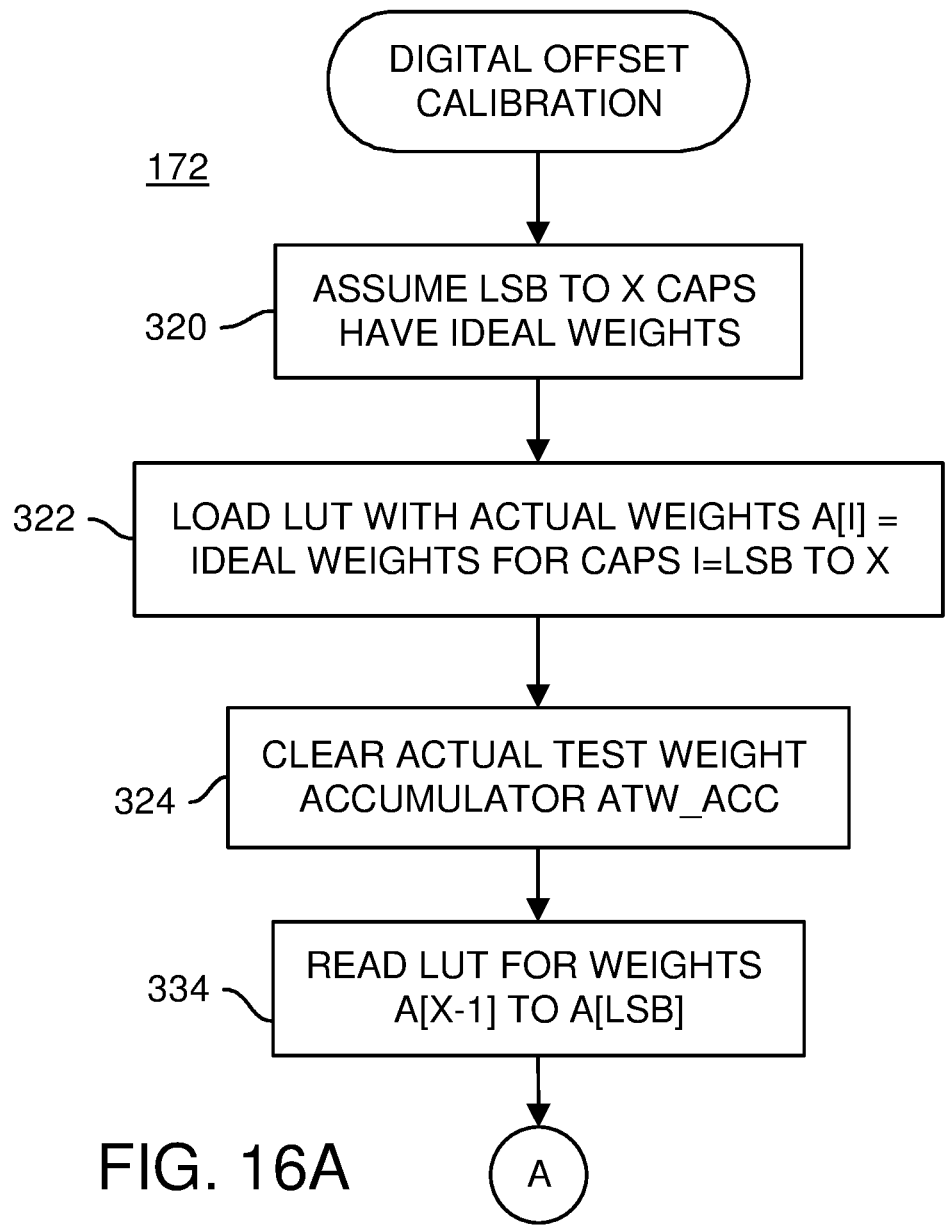
FIGS. 16A-16C show the digital residue offset calibration routine in more detail.
Figure 16B:
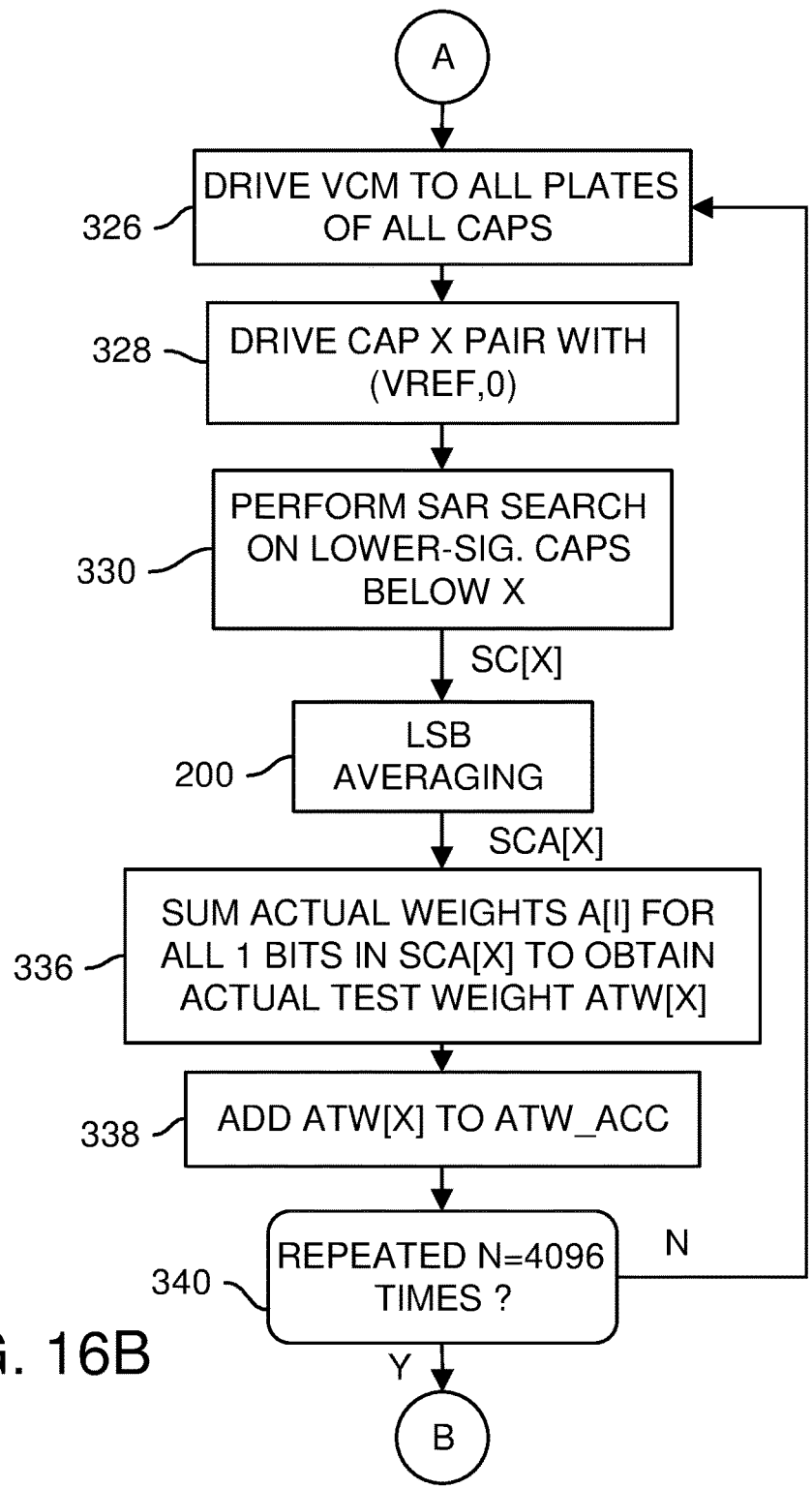
Figure 16C:
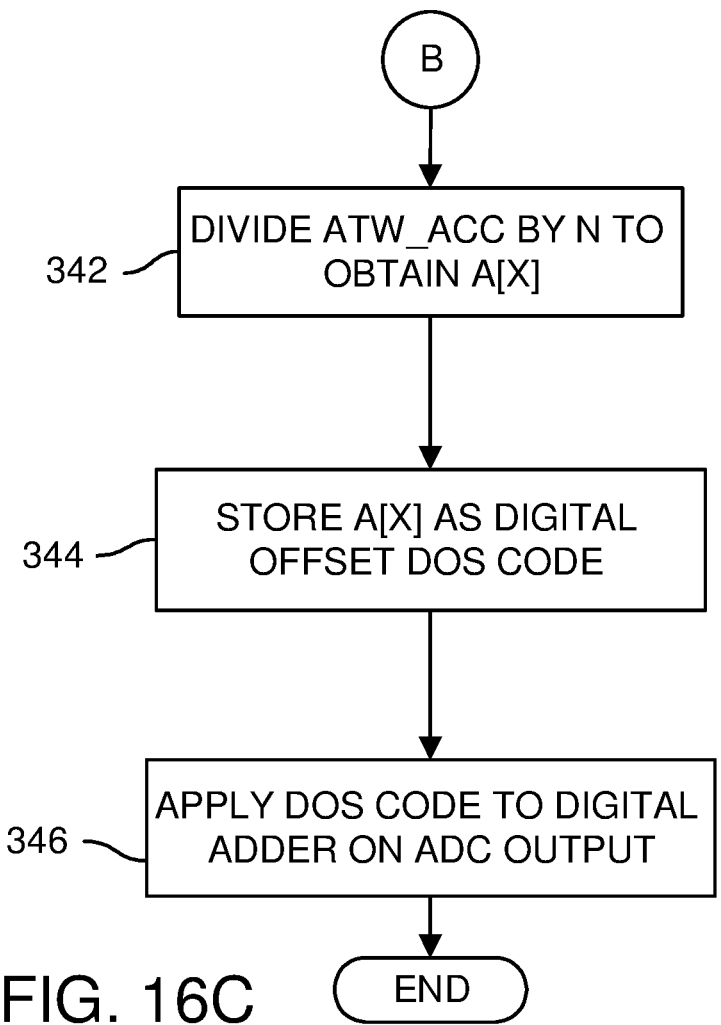

FIGS. 16A-16C show the digital residue offset calibration routine in more detail. Digital residue offset calibration 172 is executed after analog offset calibration 170 has determined the AOS code, so only a residue of the initial VOS offset remains. The least-significant capacitors, from the LSB to X, are assumed to be ideal and have no error that needs to be calibrated for, step 320. In this embodiment, only the actual weights A[i] are stored, and not the ideal radix R[i] and measured errors E[i], but both may be stored in other embodiments. The ideal radixes R[i] are calculated for the lower X LSB capacitors and stored in actual radix LUT, step 322.

The actual test weight accumulator ATW_ACC is cleared, step 324. Actual radix LUT 111 is read for the weights for the lower X−1 capacitors, step 334. These weights are the actual radixes that are assumed to be the ideal radixes, A[X−1] to A[LSB], the LSB A[1].

In FIG. 16B, all plates of all capacitors are driven with VCM, step 326. The capacitor pair at position X is driven with (VREF,0) by driving VREF to the upper capacitor X and ground to the lower capacitor X, step 328. A SAR search is performed on the lower bits, from positions X−1 to 1, step 330. The SAR search routine is shown later in FIG. 19. When the SAR search has finished, the digital code in SAR 104 is the SAR code SC[X], which is corrected by LSB averaging using the LSB averaging capacitors in LSB averaging array 90, routine 200. LSB averaging is shown in detail later in FIG. 18. The LSB-corrected SAR code is SCA[X]. The actual weight A[i] for all bits that are set to 1 in SCA[X] are read from actual radix LUT 111 and summed together, step 336, to generate the actual test weight ATW[X] for this iteration. Then the actual test weight ATW[X] is added to the accumulated value in the actual test weight accumulator, step 338. The process is repeated from re-initializing the capacitor array at step 326 until N actual test weights ATW[X] are accumulated into ATW_ACC, step 340. N can be a large value such as 4096 to minimize any random noise effects.

In FIG. 16C, the accumulated value in the actual test weight accumulator is divided by N to generate the actual measured radix A[X], step 342. Then the actual measured radix A[X] is stored as the digital offset code DOS in DOS code register 120, step 344. The DOS code can then be applied to digital adder 122 to correct outputs during radix error calibration and during normal conversion, step 346.

Figure 17A:
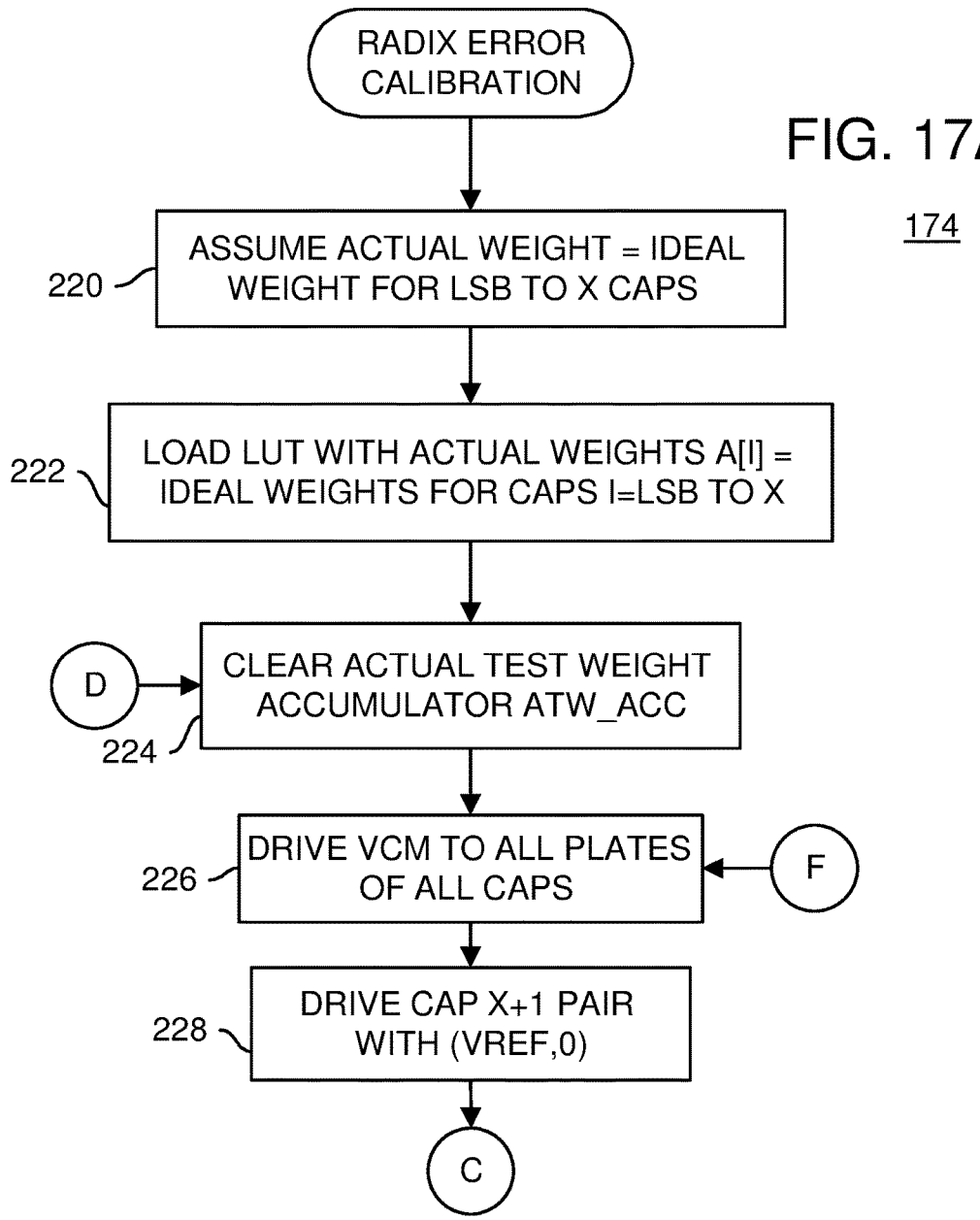
Figure 17B:
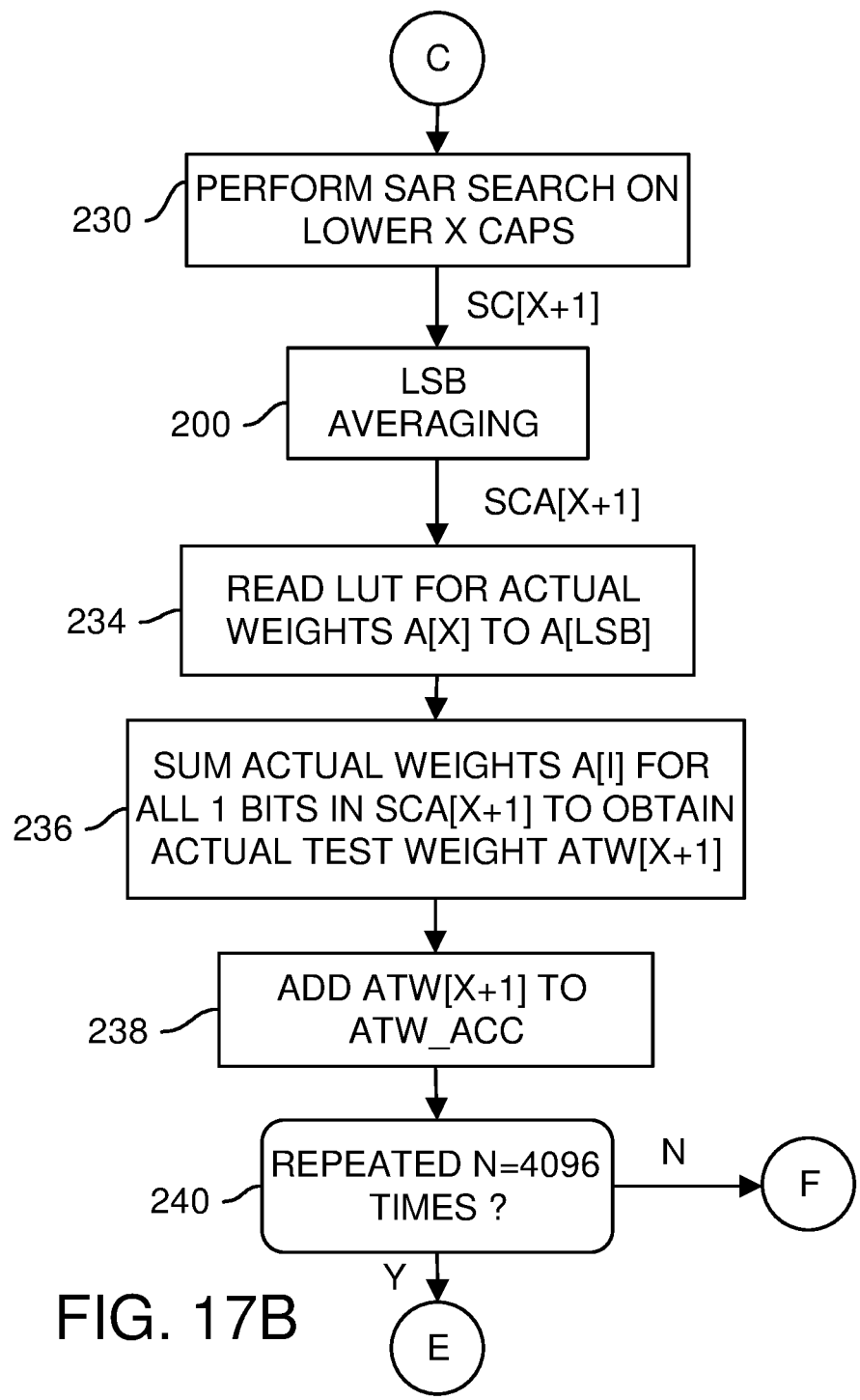

FIGS. 17A-17C show the radix error calibration routine in more detail. Radix error calibration 174 is executed after analog offset calibration 170 has determined the AOS code, and after digital residue offset calibration 172 has determined the DOS code.

The least-significant capacitors, from the LSB to X, are assumed to be ideal and have no error that needs to be calibrated for, step 220. In this embodiment, only the actual weights A[i] are stored, and not the ideal radix R[i] and measured errors E[i], but both may be stored in other embodiments. The ideal radixes R[i] are calculated for the lower X LSB capacitors and stored in actual radix LUT, step 222.

The actual test weight accumulator ATW_ACC is cleared, step 224. All plates of all capacitors are driven with VCM, step 226. The capacitor pair at position X+1 is driven with (VREF,0) by driving VREF to the upper capacitor X+1 and ground to the lower capacitor X+1, step 228.

In FIG. 17B, a SAR search is performed on the lower bits, from positions X to 1, step 230. The SAR search routine is shown later in FIG. 19. When the SAR search has finished, the digital code in SAR 104 is the SAR code SC[X+1], which is corrected by LSB averaging using the LSB averaging capacitors in LSB averaging array 90, routine 200. LSB averaging is shown in detail later in FIG. 18. The LSB-corrected SAR code is SCA[X+1].

Actual radix LUT 111 is read for the weights for the lower X capacitors, step 234. These weights are the actual radixes that are assumed to be the ideal radixes, A[X] to A[LSB], the LSB A[1]. The actual weight A[i] for all bits that are set to 1 in SCA[X+1] are read from actual radix LUT 111 and summed together, step 236, to generate the actual test weight ATW[X+1] for this iteration. Then the actual test weight ATW[X+1] is added to the accumulated value in the actual test weight accumulator, step 238. The process is repeated from re-initializing the capacitor array at step 226 until N actual test weights ATW[X+1] are accumulated into ATW_ACC, step 240.

In FIG. 17C, the accumulated value in the actual test weight accumulator is divided by N and the digital offset code DOS is subtracted to generate the actual measured radix A[X+1], step 242. Then this actual measured radix A[X+1] is stored in actual radix LUT 111, step 244. Alternately, the measured error E[X+1] can be calculated from the ideal radix R[X+1] and A[X+1] and E[X+1] stored in radix error LUT 114 and R[X+1] stored in ideal radix LUT 112.

When X+1 was not the MSB, step 246, then X is increased by one, step 248, so that the X+2 capacitor is tested, repeating from step 224 in FIG. 17A. Once the MSB has been processed, step 246, the process ends.

Figure 18:
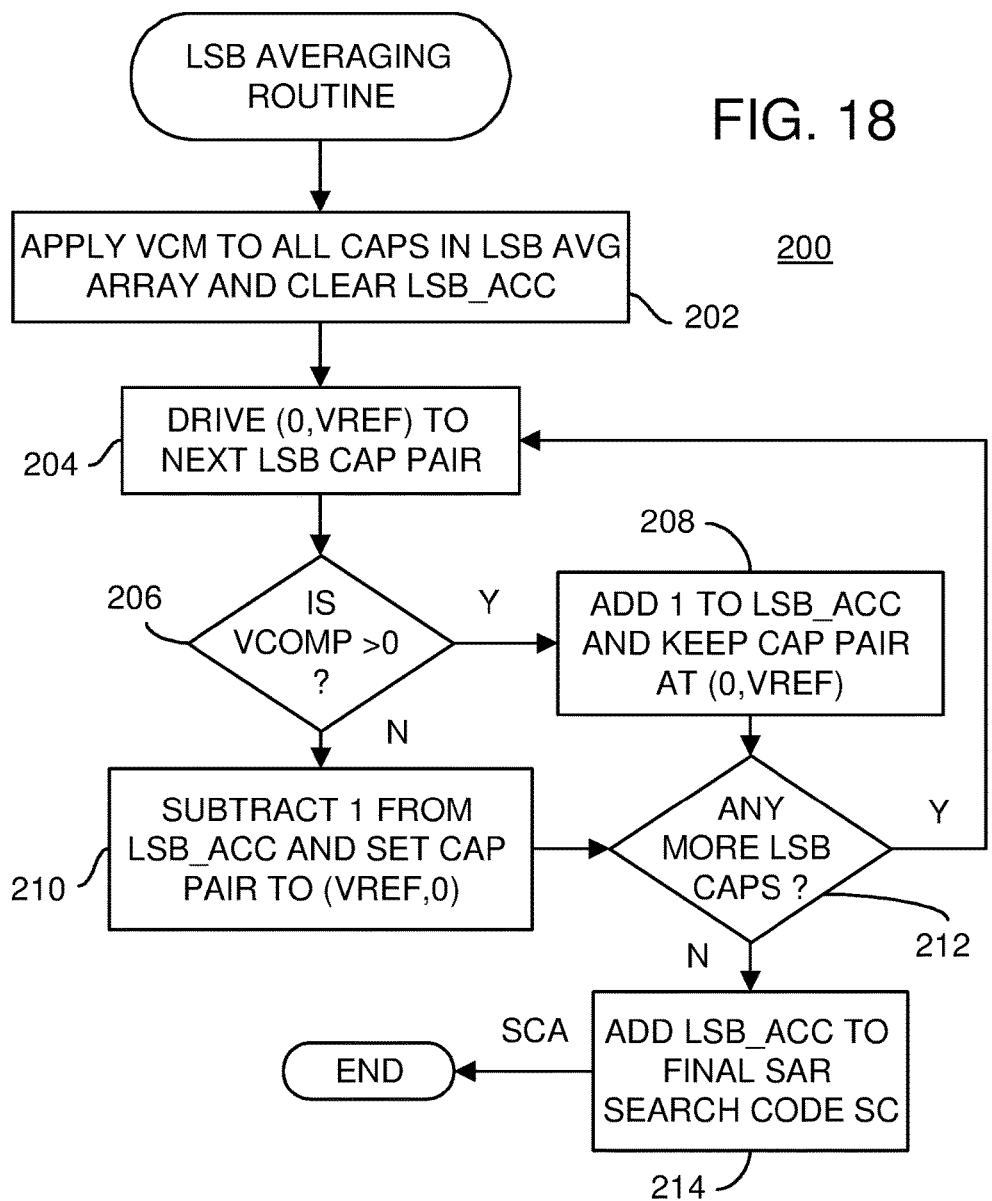
FIG. 18 shows the LSB averaging routine in more detail.

FIG. 18 shows the LSB averaging routine in more detail. LSB averaging routine 200 operates on LSB averaging array 90. All of the LSB averaging capacitors are driven to VCM, step 202, and the LSB accumulator is cleared. One of the capacitor pairs in LSB averaging array 90 is selected as the next capacitor pair, and (ground, VREF) is applied to this pair by driving ground to the upper capacitor, connected to the + input of comparator 12, and by driving VREF to the lower capacitor, connected to the −input of comparator 12, step 204.

When VCOMP is greater than zero, step 206, a +1 is added to the LSB accumulator, step 208, and the capacitor pair is kept at (ground, VREF). When VCOMP is less than zero, step 206, a −1 is added to the LSB accumulator, step 210, and the capacitor pair is flipped to (VREF, ground). When there are more capacitor pairs in LSB averaging array 90 that have not yet been evaluated, step 212, then another capacitor pair is selected and processed from step 204.

Once all capacitors in LSB averaging array 90 have been processed, step 212, then the value in the LSB accumulator is read and added to the final SAR code SC, step 214. This generates the LSB-corrected SAR code, SCA.

Figure 19:
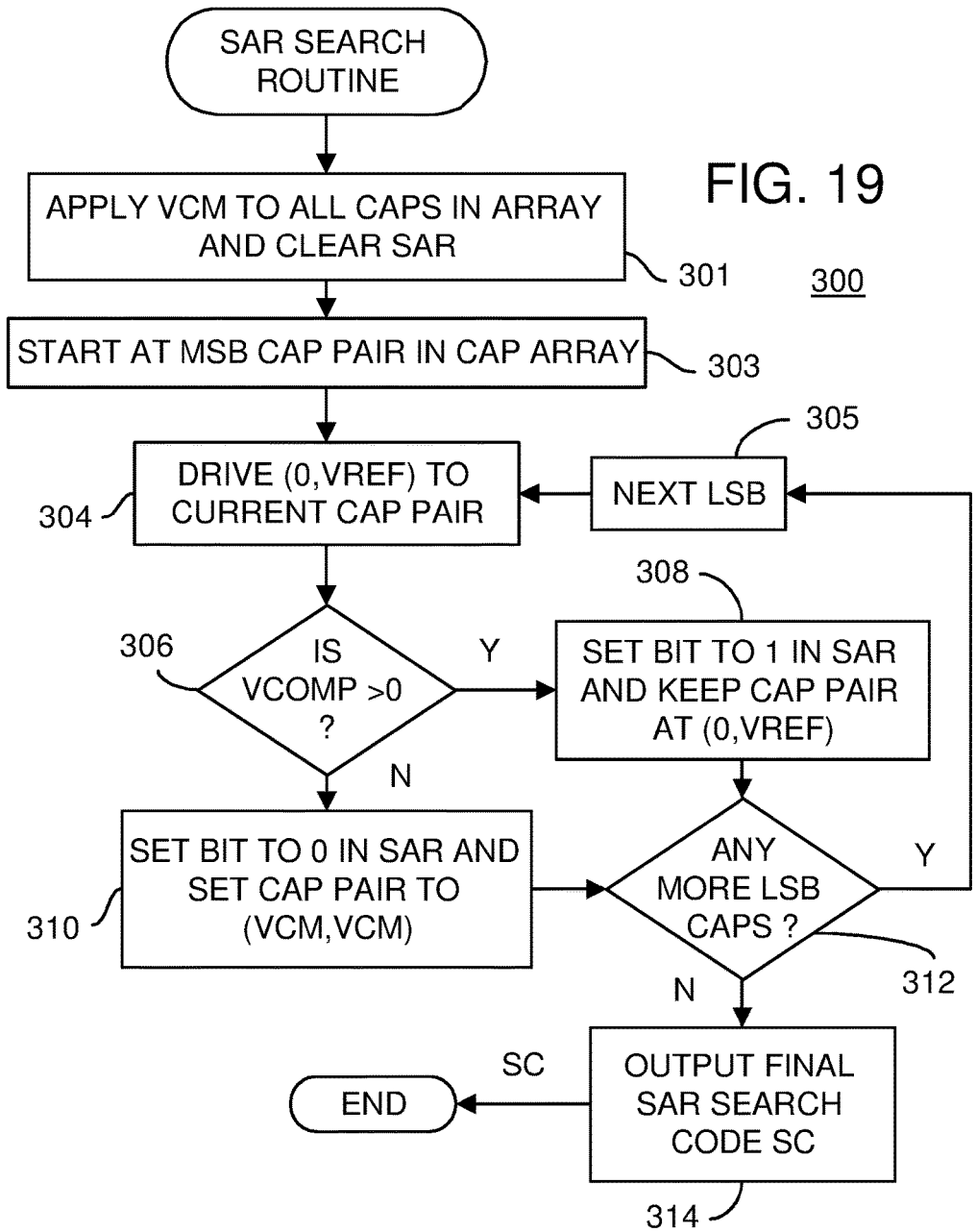
FIG. 19 shows the SAR search routine in more detail.

FIG. 19 shows the SAR search routine in more detail. SAR search routine 300 operates on main array 150, sub array 152, and sub-sub array 154. All of the capacitors in the arrays are drive to VCM, step 301, and the SAR is cleared. The most-significant or of the capacitor arrays in the range of bits being searched by the SAR search is selected, step 303, and (ground, VREF) is applied to this pair by driving ground to the upper capacitor, connected to the + input of comparator 12, and by driving VREF to the lower capacitor, connected to the − input of comparator 12, step 304.

When VCOMP is greater than zero, step 306, the corresponding bit in the SAR is set to 1, step 308, and the capacitor pair is kept at (ground, VREF). When VCOMP is less than zero, step 306, the corresponding bit in the SAR is cleared to 0, step 310, and VCM is applied to both capacitors in the capacitor pair. When there are one or more less-significant capacitor pairs in the range being SAR searched that have not yet been evaluated, step 312, then the next least-significant capacitor pair is selected, step 305, and processed from step 304.

Once all capacitors in the SAR search range have been processed, step 312, then the value in the SAR is read as the final SAR code SC, step 314.

Figure 20:
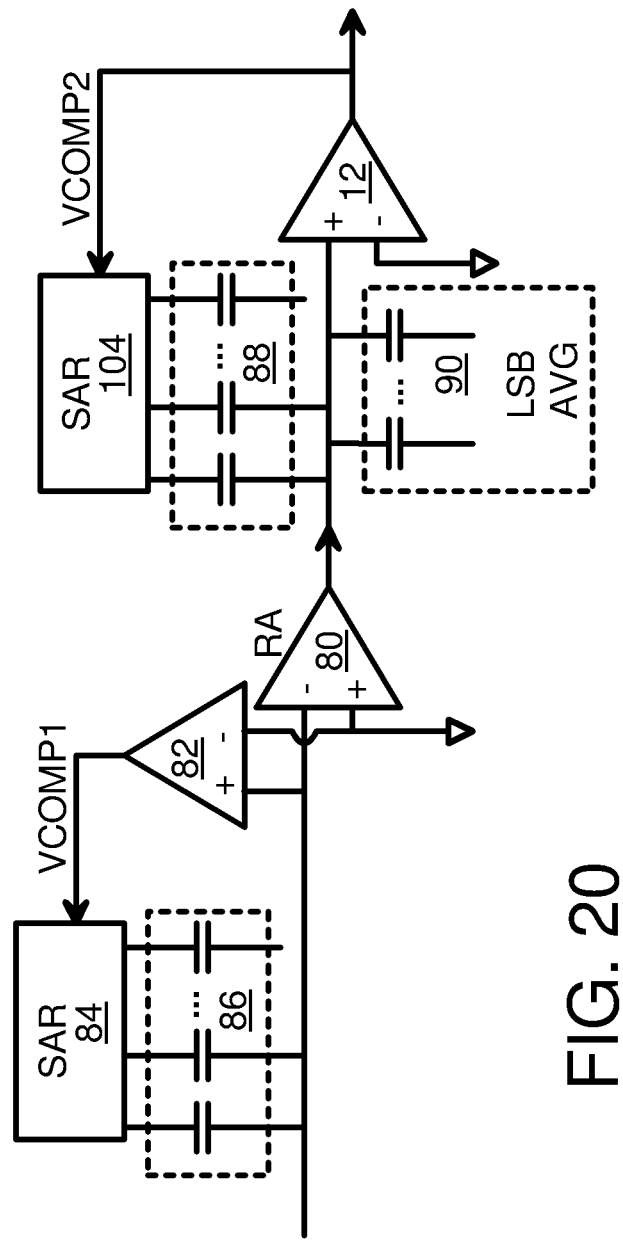
FIG. 20 shows a pipelined SAR ADC using LSB averaging for radix error calibration.

FIG. 20 shows a pipelined SAR ADC using LSB averaging for radix error calibration. Radix error calibration using LSB averaging can also be applied to pipelined ADCs. Capacitor array 88 contains capacitors of a monotonic sequence of capacitance values, such as 1C, 1C, 2C, 3C, 5C, 10C, 17C, 32C. SAR 104 drives the SAR search sequence onto capacitor array 88 and checks VCOMP2 from comparator 12 as described before for the radix error calibration routine. LSB averaging array 90 operates to correct the final SAR value using LSB averaging as described before.

Similarly, SAR 84 drives a SAR search sequence to capacitor array 86 and examines VCOMP1 from comparator 82 to set and clear SAR bits. Amplifier 80 connects the two stages together to form a pipeline SAR-ADC. Amplifier 80 has a gain that is greater than 1, such as a gain of 32, so the noise effect from capacitor array 86 at comparator 12 is smaller at a given resolution because of the gain of amplifier 80. Higher-resolution ADC's are possible using the pipelined architecture.

Figure 21:
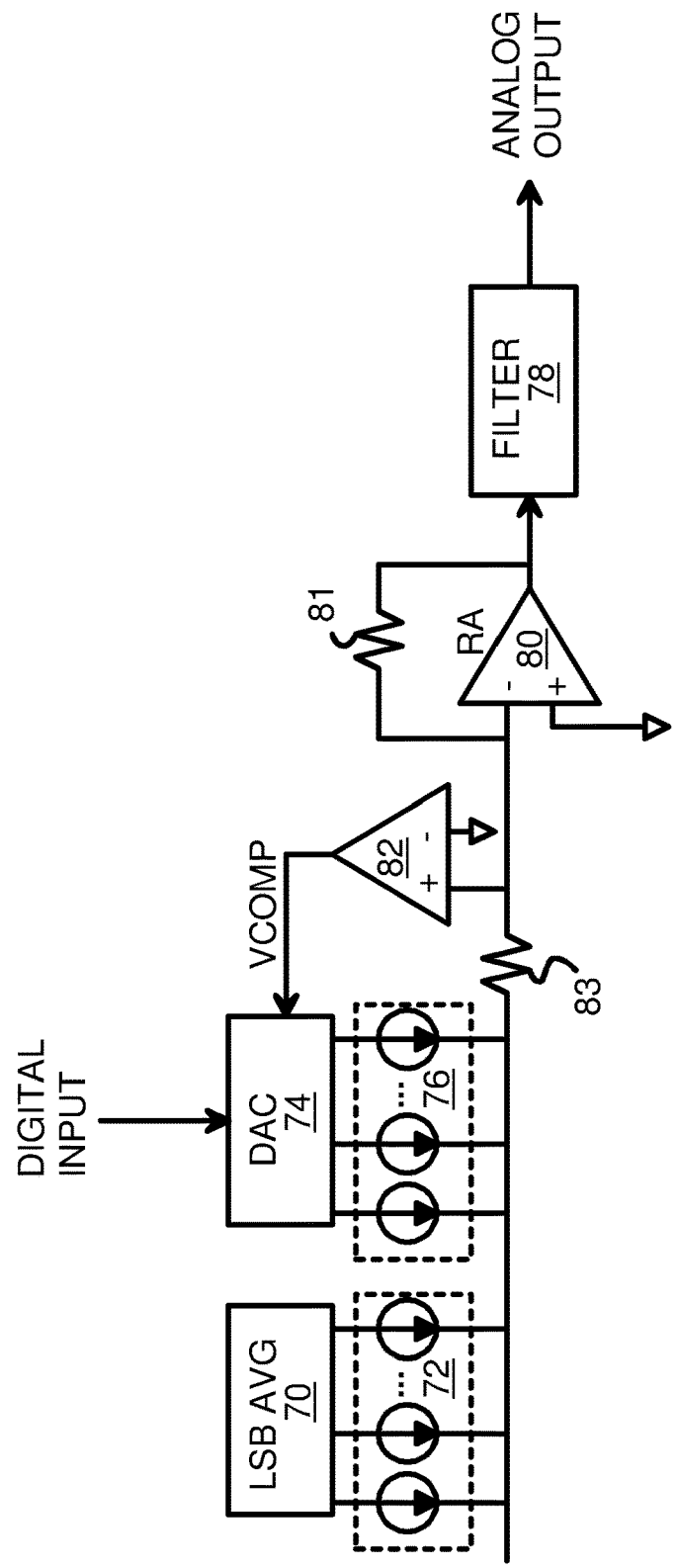
FIG. 21 shows a DAC using LSB averaging for radix error calibration.

FIG. 21 shows a DAC using LSB averaging for radix error calibration. Radix error calibration using LSB averaging can also be applied to DAC's. In this example capacitors are replaced by current sources as the analog-digital elements. Current sources 72 all have a minimum current and are turned on and off during LSB averaging by LSB averaging controller 70. Current sources 76 have different values such as 1, 2, 3, 5, 10, 17, 32 times the minimum current value. DAC 74 receives a digital input and drives digital bits to current sources 76 to adjust the current from current sources 76. The summed current from current sources 72, 76 passes through resistor 83 to create a voltage that is sensed by comparator 82 to generate VCOMP, which is used by LSB averaging controller 70 to turn on and off current sources 72, or by DAC 74 during calibration to measure actual currents from current sources 76. Amplifier 80 with feedback resistor 81 buffer the analog current and filter 78 filters the output to generate an analog output.

ALTERNATE EMBODIMENTS

Several other embodiments are contemplated by the inventors. For example, while differential comparison with comparator 12 of fully differential capacitor arrays have been shown with matching upper and lower capacitor arrays, single-ended calibration could also be substituted by connecting one input of comparator 12 to ground or to another fixed voltage, and eliminating the lower capacitor arrays.

While an ADC with a capacitor array has been described, radix error calibration can be applied to other mixed-signal circuits such as Digital-to-Analog Converters (DACs). While capacitors 14-19 have been described, these capacitors are digital-analog elements that convert a digital signal from SAR 104 into an analog voltage sensed by comparator 12. Other kinds of digital-analog elements could be substituted, such as the parallel current sources of FIG. 21, resistors, or various combinations, and in parallel, serial, or combined network arrangements.

LSB averaging can be considered to be an analog averaging technique, since analog voltages are evaluated by comparator 12. Repeating measurements N times and then averaging the digital values that result from the measurements is a digital averaging technique. Thus both analog and digital averaging are preformed by the calibration routine. Circuit noise errors are thus reduced by averaging in both the analog and digital domains, resulting in better linearity.

The analog offset calibration, digital residue offset calibration, and radix error calibration shown in FIG. 7 may be executed together as part of a single calibration routine. External signals are not needed for calibration, so this overall calibration routine is a self-calibration routine. The calibration routine may be executed on power-up, and may be repeated periodically, or when other parts of the system detect a temperature or supply voltage shift, or detect other problems such as aging.

While capacitors having values of 1, 1, 2, 3, 5, 10, 17, 32 times the unit capacitance C have been described, other values may be substituted. Binary-weighted values such as 1, 1, 2, 4, 8, 16, 32 may be used. However, the sum of the capacitor values below the MSB is 1+1+2+4+8+16=32 while for the non-binary array is 1+1+2+3+5+10+17=38. Since 38 is 6 more than the MSB of 32, a measured radix up to 38 can be detected for the 32C capacitor, while for the binary example radixes above the nominal 32 cannot be detected. Thus a monotonic non-binary series of capacitor values has an advantage of being able to detect a mismatch on the MSB that is greater than the MSB. The cost is one additional capacitor pair.

Capacitor sizes and radixes do not have to be integer ratios of each other, but could have fractional or decimal ratios. In FIGS. 5-6, 10-12, and 14, capacitors 14-19 can be considered to be DAC elements, since they convert a digital signal (the SAR code from SAR 104) to an analog voltage (on the lines input to comparator 12). Other kinds of DAC elements may be substituted, such as resistors (such as in variable voltage dividers 20, 21) or current sources (such as in FIG. 21). These DAC elements can be in series or in parallel or both, and can have binary weighted ratios or monotonically non-binary ratios, such as the 1, 1, 2, 3, 5, 10, 17, 32 sequence. Ratios may be integer or non-integer. The radix error calibration routine may be modified for use with these alternative DAC elements, such as parallel current sources.

The number of LSB averaging capacitors 92-98 can be a fairly large number, such as 47 pairs to allow for a noise distribution of as much as +/−6 LSB's to be reduced to +/−2 LSB's. The size of LSB averaging capacitors 92-98 do not have to all be 1C, but could have other values, such as 0.5C, 2C, etc. Some LSB averaging capacitors could be larger than other LSB averaging capacitors, and the amount added or subtracted from the LSB accumulator could be multiplied by the relative weights. LSB averaging could be enabled or disabled for normal ADC conversions, using the same LSB averaging array 90 or a different LSB averaging array.

In another LSB averaging variation, the first four pairs of LSB averaging capacitors are over-weighted so that +2 or −2 is added to the LSB accumulator for each LSB capacitor pair. Then the next 8 capacitor pairs are normally weighted, adding +1 or −1 to the LSB accumulator, while the final 4 capacitor pairs are half-weighted, adding +0.5 or −0.5 to the LSB accumulator. All 36 LSB capacitors have the same 1C unit capacitance, but have 3 different weightings when being accumulated.

More sophisticated statistical methods could be combined with LSB averaging. For example, the LSB accumulator could be modified to be a Maximum Likelihood Estimator (MLE) or a Bayes Estimator (BE). The increment added or subtracted in the LSB accumulator could be modified for the LSB capacitor weight, or with a statistical weight factor such as for MLE or BE.

MLE and BE may estimate the noise added on code during the SAR search. This noise estimate can be to subtracted from the code that becomes noise free. As an example, after a SAR search for the X+1 radix, the output code is SC[X+1]+DOS+noise, where noise is k*σ (k is parameter and σ is ADC noise). By simulation or measurement, σ can be accurately estimated. For example, assuming σ=2 LSB, then if k can be predicted then noise can be cancelled or reduced by a large amount. For MLE, noise is generally modeled as bell-shaped distribution. As long as the frequency of occurrence is known, k can be predicted from the inverse of a gaussian distribution. After the SAR search with or without some LSB averaging trials, then LSB repeat trials, such as comparing −1 LSB for 16 times, SC[X+1]−1 LSB is continuously compared for 16 or 32 times, and the number of "1" and "0" bits are counted. Then k is calculated from the formula $F^{-1}$ (m/N), where m denotes the number of "1" bits and N denotes a total number of LSB trials. If m>N/2, k is positive. If m<N/2, k is negative. If m=N/2, k=0. The larger the number of N (typically at least 16), the higher the accuracy. Similarly, if the estimation is BE, the additional information of SC[X+1] is used as posterior distribution. The estimation of k using this approach is more accurate than MLE at the cost greater complexity. The code distribution on the radix search may be reduced further using MLE or BE.

The repetition factor N can be set to a large value, such as 512, 1024, 4096, or to other values, to filter out noise and other random errors that occur during calibration. While the repetition factor N has been described as being the same for all types of calibration, different repetition factors could be used for different types of calibration, and for LSB averaging. Digital residue offset calibration 172 could use a larger value of N than does analog offset calibration 170.

While two variable voltage dividers 20, 21 have been described that are identical, other circuits or methods could be used to generate the differential adjusting voltage from the AOS code. The AOS code could be complemented and applied to the second variable voltage divider, which could have reversed analog voltages applied. Variable voltage dividers 20, 21 could also be a resistor-based DAC, such as a 11-bit DAC for an 11-bit AOS code. Another alternative is to use a binary-weighted capacitor array on the input line to comparator 12, with the AOS code applied to this binary-weighted capacitor array to provide an offset to counteract VOS to comparator 12.

Comparator 12 can use many different circuit arrangements besides that shown in FIG. 9 and may or may not have a latch on its output. For example, comparator 12 can be implemented by a gain amplifier as an alternative. A serial interface could be coupled to SAR 104 and an external processor used to execute routines to perform some or all of the functions of calibration sequencer 108.

The ideal radixes R[X] could be pre-computed and stored in a read-only memory (ROM) and then copied to ideal radix LUT 112. A larger ROM or other memory to implement actual radix LUT 111 could have one entry for each possible value of the SAR code, such as 128 entries, with a pre-computed sum of all the 1 bits in the SAR code. Then adder 118 would not be needed, since the function of adder 118 is incorporated into the data stored in the LUT. Other such variations and data manipulations are possible. In particular, the DOS code added by digital adder 122 could be subtracted from the fully-expressed values in actual radix LUT 111 that has one entry for each possible value of SAR code SCA. The gain factor GF could likewise be incorporated into the values stored in actual radix LUT 111. Data could be stored as two's-complement integers or floating point values in a variety of data formats.

Values may be shifted, transformed, or processed in a variety of ways. A single-ended or a fully differential ADC may be used. Equalizing switches could be added between true and complementary nodes for reset and equalization. Additional calibration hardware and routines may be added. ADC's or other logic may be interleaved, and sub-ADC/DAC's may be used or added. Other circuits using switched capacitors may incorporate the invention, such as a switched-capacitor programmable-gain residue amplifier.

The number of bits may be adjusted. For example, a 15 bit ADC could be used, or an 8-bit, 22-bit, or 18-bit. A different number of bits could be substituted for a different precision, and the number of bits could be fixed or could be variable.

Both differential and single-ended analog voltages may be converted. A single-ended analog voltage may be applied to one differential input, while a reference voltage is applied to the other differential input. A sample-and-hold block may be added that is a circuit, unit, or network of analog switches, capacitors, op amps, and various combinations. State machines, firmware, software, or hardware may be used to control sequencing such as the test digital values from Calibration sequencer 108 or SAR 104.

Some embodiments may not use all components. For example, switches and buffers may be added or deleted in some embodiments. Different kinds of switches may be used, such as 2-way switches or 3-way switches. Muxes may be used as switches. Input resistors could be added to the analog input or to the inputs of comparator 12, or more complex input filters used. Multiple levels of switches may be used, such as 2-way switches for switches, and then an overall switch that connects either VREF or GND to these 2-way switches.

While binary-weighted conversion has been described, other weightings could be substituted, such as decimally-weighted, prime-weighted, or linearly-weighted, or octal-weighted. The digital value could be in these other number systems, such as octal numbers rather than binary numbers.

Inversions may be added by swapping inverting and non-inverting inputs as desired, but do not change the overall function and thus may be considered equivalents. The resistance and capacitance values may vary in different patterns. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes. Capacitors may be connected together in parallel to create larger capacitors that have the same fringing or perimeter effects across several capacitor sizes.

The number of bit-positions that are considered to have ideal weights could vary or could even be programmable or user-selectable. Some of the MSB capacitors in sub-sub array 154 could be calibrated for higher-precision applications, while some the LSB capacitors in sub array 152 could be considered ideal and not calibrated in other lower-precision applications.

After digital residue offset calibration 172 has generated the DOS code, during radix error calibration 174 the intermediate results could be sent through digital adder 122 to have the DOS correction subtracted to correct for the digital residue offset. Alternately, once actual measured radix A[X] for 10C capacitor 15 is obtained, R[X] and E[X] for this 10C capacitor 15 could be stored in ideal radix LUT 112 and radix error LUT 114, respectively, and used for computing the measured radixes for other more-significant bits during radix error calibration 174. FIG. 17C, step 242 or 244 can subtract the DOS code, or DOS code subtraction may be skilled when accuracy is sufficient. The DOS code from DOS code register 120 could also be subtracted from the digital code DC by adder 118. Other arrangements and grouping of adders and multipliers are possible.

The ADC of FIG. 12 having three identical capacitor arrays of 1C to 32C capacitors has 21 significant bits, but its overall accuracy may be reduced due to attenuation capacitors 42, 44 so that it has only 18 bits of effective accuracy. The effective accuracy, such as 18b accuracy, is the sum of all radixes ($\log_2 A[X]$). In the example, it is 18.2-bit, after DG correction, and it normalizes to 18-bit effective accuracy. Other numbers of bits and capacitor arrangements can be substituted for ADC's of varying design accuracy.

References such as bandgap references may be used to generate VREF. While analog voltage sensing has been described, analog currents may be sensed rather than voltages by passing the analog current through a resistor to develop an analog voltage.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A self-calibrating mixed-signal converter comprising:
an array of digital-analog elements, each for converting a binary bit to an analog signal;
a comparator that compares two analog inputs to generate a compare result;
a Least-Significant-Bit (LSB) digital-analog element in the array of digital-analog elements, the LSB digital-analog element having a smallest effect on the two analog inputs, the LSB digital-analog element having an ideal radix of one;
wherein other digital-analog elements in the array of digital-analog elements each have an ideal radix that is a function of a ratio of a design size of a digital-analog element to the design size of the LSB digital-analog element;
wherein the array of digital-analog elements comprise at least five digital-analog elements with different design sizes and having at least five different values of the ideal radix;
wherein the array of digital-analog elements is connected to at least one of the two analog inputs to the comparator wherein each of the at least five digital-analog elements with different design sizes cause at least five different values of an effect on at least one of the two analog inputs to the comparator;
wherein manufactured sizes of the digital-analog elements differ from the design sizes by an error amount;
a Successive-Approximation Register (SAR) that applies a SAR search sequence of binary bits to a portion of the array of digital-analog elements having an ideal radix less than a target ideal radix of a target digital-analog element in the array of digital-analog elements;
wherein bits are set or cleared in the SAR during the SAR search sequence in response to the compare result from the comparator to generate a final SAR value when the SAR search sequence is completed;
a plurality of LSB averaging digital-analog elements, having an ideal radix of 1, and connected to at least one of the two analog inputs to the comparator;
a LSB averaging accumulator that is incremented or decremented in response to the compare result from the comparator when test values of binary bits are applied to the plurality of LSB averaging digital-analog elements, the LSB averaging accumulator adjusting the final SAR value after the SAR search sequence is completed to generate a LSB-corrected final SAR value;
a summer for summing the ideal radixes for digital-analog elements having a corresponding bit set in the LSB-corrected final SAR value to generate a target measured radix;
a digital averager for averaging a plurality of the LSB-corrected final SAR value generated during a plurality of repetitions of the SAR search sequence measuring the target digital-analog element, the digital averager generating an actual measured radix that is the average of the plurality of the LSB-corrected final SAR value; and
a Look-Up Table (LUT) that stores the actual measured radix from the digital averager for the target digital-analog element, the LUT also storing the ideal radixes for the portion of the array of digital-analog elements having the ideal radix that is less than the target ideal radix of the target digital-analog element;
wherein the LUT also stores actual measured radixes for other digital-analog elements having an ideal radix greater than the target radix, the other digital-analog elements each successively acting as the target digital-analog element in the SAR search sequence and digital averager to generate the actual measured radix for that digital-analog element;
wherein the summer reads the LUT for the actual measured radix for digital-analog elements having a corresponding actual measured radix stored in the LUT, the summer using the actual measured radix rather than the ideal radix when the actual measured radix is available in the LUT to generate a target measured radix during calibration;
whereby radix error calibration uses the actual measured radix that is read from the LUT instead of the ideal radix for radixes above the target ideal radix, and uses the ideal radix for radixes below the target ideal radix.

2. The self-calibrating mixed-signal converter of claim 1 further comprising:
a converter that performs the SAR search sequence on all digital-analog elements to generate a SAR code, the converter reading the LUT for the actual measured radix for digital-analog elements having a corresponding actual measured radix stored in the LUT, the summer using the actual measured radix rather than the ideal radix when the actual measured radix is available in the LUT to generate a converter result;

wherein the converter uses the actual measured radix that is read from the LUT instead of the ideal radix for radixes above the target ideal radix, and uses the ideal radix for radixes below the target ideal radix, to generate the converter result for normal conversion after calibration is completed.

3. The self-calibrating mixed-signal converter of claim 1 wherein the plurality of LSB averaging digital-analog elements further comprise variable digital-analog elements having an ideal radix other than 1, wherein the LSB averaging accumulator is incremented or decremented by the ideal radix other than 1 for the variable digital-analog elements.

4. The self-calibrating mixed-signal converter of claim 1 further comprising:
a Maximum Likelihood Estimator (MLE) that uses a MLE function to generate a statistical weight for one or more LSB averaging digital-analog elements in the plurality of LSB averaging digital-analog elements;
wherein the LSB averaging accumulator is incremented or decremented by the statistical weight for the one or more LSB averaging digital-analog elements.

5. The self-calibrating mixed-signal converter of claim 1 further comprising:
a Bayes Estimator (BE) that generates a statistical weight for one or more digital-analog elements in the plurality of LSB averaging digital-analog elements using a Bayes function;
wherein the LSB averaging accumulator is incremented or decremented by the statistical weight for the LSB averaging digital-analog element.

6. The self-calibrating mixed-signal converter of claim 1 wherein the Look-Up Table (LUT) stores the actual measured radix as the ideal radix and a measured error, wherein the measured error is calculated as a difference of the actual measured radix and the ideal radix.

7. The self-calibrating mixed-signal converter of claim 1 wherein the ideal radixes form a non-binary monotonic sequence, wherein a sum of the ideal radixes for all digital-analog elements having less-significance than the target digital-analog element is greater than the ideal radix of the target digital-analog element,
wherein the non-binary monotonic sequence allows for both positive and negative measured errors.

8. The self-calibrating mixed-signal converter of claim 1 wherein the array of digital-analog elements comprise a capacitor array, each capacitor in the capacitor array having one terminal connected to one of the two analog inputs to the comparator, each capacitor having a second terminal that receives voltages that are selectively connected to the capacitor by a binary bit in the SAR search sequence,
wherein the self-calibrating mixed-signal converter is an Analog-to-Digital Converter (ADC).

9. The self-calibrating mixed-signal converter of claim 1 wherein the array of digital-analog elements comprise a plurality of current sources that are connected in parallel;
wherein the self-calibrating mixed-signal converter is an Digital-to-Analog Converters (DAC).

10. A radix error calibrating method for calibrating a mixed-signal converter, the method comprising:
loading a Look-Up Table (LUT) with ideal radixes for capacitors having an ideal radix that is less than a target radix, the capacitors being in a capacitor array of the capacitors;

(c) clearing a test accumulator;
driving a common-mode voltage onto outer terminals of all capacitors having an ideal radix above the target radix;
(b) driving a reference voltage to an outer terminal of an upper capacitor having the target radix;
driving ground to an outer terminal of a lower capacitor having the target radix;
driving a Successive-Approximation Register (SAR) search sequence of voltages onto outer terminals of capacitors having an ideal radix less than the target radix and examining a comparator output of a comparator having inputs connected to inner terminals of the capacitors to determine when to set or clear binary bits in a SAR value;
clearing a Least-Significant-Bit (LSB) accumulator;
driving a common-mode voltage onto outer terminals of all LSB averaging capacitors in an LSB averaging array, each LSB averaging capacitor having an ideal radix that is no more than double a LSB radix, the LSB radix being for a LSB capacitor in the array of capacitor;
(a) driving the reference voltage to an outer terminal of a lower LSB capacitor in the LSB averaging array;
driving ground to an outer terminal of an upper LSB capacitor in the LSB averaging array;
examining the comparator output and incrementing the LSB accumulator when the comparator output is positive, and decrementing the LSB accumulator when the comparator output is negative;
driving the reference voltage to the outer terminal of the upper LSB capacitor and driving ground to the outer terminal of the lower LSB capacitor when the comparator output is negative;
repeating from (a) for other LSB averaging capacitors until all LSB capacitors have been evaluated;
adding the LSB accumulator to the SAR value to generate a LSB-corrected SAR value;
reading the LUT for radixes corresponding to all 1 bits in the LSB-corrected SAR value, and summing the radixes for all 1 bits to generate a test weight;
adding the test weight to the test accumulator;
repeating from (b) until N test weights have been accumulated into the test accumulator, and dividing the test accumulator by N to generate a digital average test weight;
wherein N is an integer of at least 4;
storing the digital average test weight into the LUT as the radix for the target radix; and
moving the target radix to a next most-significant radix for capacitors in the capacitor array and repeating from (c) to store the digital average test weight into the LUT as the radix for the next most-significant radix until a Most-Significant-Bit (MSB) radix has been stored in the LUT.

11. The radix error calibrator of claim 10 wherein incrementing the LSB accumulator further comprises adding a scaled increment to the LSB accumulator, the scaled increment being scaled by a ratio of the ideal radix of the LSB averaging capacitor to the LSB radix;
wherein decrementing the LSB accumulator further comprises subtracting the scaled increment from the LSB accumulator.

12. The radix error calibrator of claim 10 wherein incrementing the LSB accumulator further comprises adding a scaled increment to the LSB accumulator, the scaled increment being scaled by a statistical factor;

wherein decrementing the LSB accumulator further comprises subtracting the scaled increment from the LSB accumulator.

13. The radix error calibrator of claim 12 further comprising:
generating the scaled increment using a Maximum Likelihood Estimator (MLE) or a Bayes Estimator (BE).

14. The radix error calibrator of claim 10 further comprising initially executing a analog offset calibration routine comprising:
(d) driving outer terminals of all capacitors in the array and all LSB averaging capacitors to the common-mode voltage;
applying a binary search sequence to a digital input of a variable voltage divider that generates an adjusting voltage to the comparator, the adjusting voltage adjusting the comparator output;
determining a toggling value of the digital input that toggles the comparator output between positive and negative;
adding the toggling value to a toggling accumulator;
repeating from (d) until M toggling values have been accumulated;
wherein M is an integer of at least 4;
dividing a final value of the toggling accumulator by M to generate an analog offset code; and
applying the analog offset code to the variable voltage divider.

15. A self-calibrating Analog-to-Digital Converter (ADC) comprising:
a capacitor array having capacitors connected to a summing line, the capacitors having a plurality of design sizes that are multiples of a Least-Significant-Bit (LSB) design size, an ideal radix being a function of a ratio of a design size to the LSB design size;
a comparator receiving the summing line on a comparator input and generating a comparator output;
a Successive-Approximation Register (SAR) for applying a SAR search sequence of binary bits to terminals of the capacitors in the capacitor array;
a Look-Up Table (LUT) for storing radixes of capacitors in the capacitor array, the LUT storing the ideal radix for lower-significance capacitors in the capacitor array wherein the ideal radix is below a threshold radix, and for storing an actual measured radix for higher-significance capacitors in the capacitor array wherein the ideal radix is above a threshold radix;
an LSB averaging array of LSB averaging capacitors having a design size no more than twice the LSB design size, the LSB averaging capacitors connected to the summing line;
a calibration sequencer that activates the SAR to apply the SAR search sequence to capacitors having ideal radixes below a target radix, and for successively setting or clearing binary bits in the SAR in response to a polarity of the comparator output to generate a SAR code;
a LSB averager that applies test voltages to terminals of the LSB averaging capacitors and increments or decrements a LSB of the SAR code in response to the comparator output to generate a corrected SAR code;
a digital averager that activates the calibration sequencer to repeat the SAR search sequence and to activate the LSB averager to repeatedly generate corrected SAR codes that are averaged together to generate an averaged corrected SAR code; and
a summer for reading radixes from the LUT and summing together radixes corresponding to all 1 bits in the averaged corrected SAR code to generate an actual measured radix that is written into the LUT for the capacitor having the target radix;
the calibration sequencer selecting a next-most-significant radix to the target radix as a new target radix and repeating the SAR search sequence for a new target radix to generate an actual measured radix for the new target radix for storage in the LUT,
whereby actual measured radixes are generated from the SAR search sequence that is corrected by LSB averaging and then digital averaged to reduce errors.

16. The self-calibrating ADC of claim 15 further comprising:
a plurality of switches, each switch in the plurality of switched connected to a terminal of a capacitor in the capacitor array, each switch controlled by a binary bit in the SAR search sequence to selectively apply a reference voltage or a ground voltage or an analog input voltage to the capacitor.

17. The self-calibrating ADC of claim 15 further comprising:
a mirror capacitor array having capacitors connected to a mirror summing line, the capacitors having a plurality of design sizes that are multiples of the LSB design size;
wherein the comparator further receives the mirror summing line on an input and generates the comparator output as a function of a difference between the summing line and the mirror summing line.

18. The self-calibrating ADC of claim 15 further comprising:
a first attenuating capacitor that is coupled between a first segment and a second segment of the summing line;
a second attenuating capacitor that is coupled between the second segment and a third segment of the summing line;
wherein the capacitor array is divided into a main array, a sub array, and a sub-sub array;
wherein the main array is connected to the first segment, the first segment connected to the comparator input;
wherein the sub array is connected to the second segment, the first segment connected to the comparator input through the first attenuating capacitor;
wherein the sub-sub array is connected to the third segment, the third segment connected to the second segment through the second attenuating capacitor, the third segment connected to the comparator input through the first attenuating capacitor and through the second attenuating capacitor;
wherein the LSB averaging array is connected to the third segment.

19. The self-calibrating ADC of claim 18 wherein the second attenuating capacitor attenuates by a factor of J, wherein J is a positive decimal;
wherein ideal radixes in of capacitors in the sub array are J times an ideal radix of a capacitor in the sub-sub array having a same design size;
wherein the first attenuating capacitor and the second attenuating capacitor together attenuate by a factor of K, wherein K is a positive decimal;
wherein ideal radixes in of capacitors in the main array are K times an ideal radix of a capacitor in the sub-sub array having a same design size.

20. The self-calibrating ADC of claim 15 further comprising:
a digital residue offset calibration sequencer for setting a largest sub-threshold radix having a radix value that is at or below the threshold radix as the target radix, and for activating the calibration sequencer, the LSB averager, the digital averager, and the summer to generate the actual measured radix for the largest sub-threshold radix;

a Digital-Offset (DOS) code register for storing the actual measured radix for the largest sub-threshold radix as a DOS code; and a digital adder for subtracting the DOS code from the DOS code register from an output of summer that sums radixes read from the LUT during a normal conversion after calibration is completed.

\* \* \* \* \*